(12) United States Patent
Brodoceanu et al.

(10) Patent No.: US 11,424,214 B1
(45) Date of Patent: Aug. 23, 2022

(54) HYBRID INTERCONNECT FOR LASER BONDING USING NANOPOROUS METAL TIPS

(71) Applicant: Meta Platforms Technologies, LLC, Menlo Park, CA (US)

(72) Inventors: Daniel Brodoceanu, Cork (IE); Zheng Sung Chio, Cork (IE); Oscar Torrents Abad, Cork (IE); Jeb Wu, Redmond, WA (US); Ali Sengül, Zurich (CH)

(73) Assignee: Meta Platforms Technologies, LLC, Menlo Park, CA (US)

( * ) Notice: Subject to any disclaimer, the term of this patent is extended or adjusted under 35 U.S.C. 154(b) by 287 days.

(21) Appl. No.: 16/783,580

(22) Filed: Feb. 6, 2020

Related U.S. Application Data

(60) Provisional application No. 62/913,645, filed on Oct. 10, 2019.

(51) Int. Cl.
*H01L 23/00* (2006.01)
*H01L 25/18* (2006.01)
(Continued)

(52) U.S. Cl.
CPC .............. *H01L 24/80* (2013.01); *H01L 24/05* (2013.01); *H01L 25/167* (2013.01); *H01L 25/18* (2013.01); *H01L 25/50* (2013.01); *H01L 2224/05541* (2013.01); *H01L 2224/05644* (2013.01); *H01L 2224/80009* (2013.01);
(Continued)

(58) Field of Classification Search
CPC .......................... H01L 2224/8012–8018; H01L 2224/8112–8118; H01L 2224/802–80238; H01L 2224/812–81238; H01L 2224/808–80899; H01L 2224/818–81899; H01L 2224/80444; H01L 2224/80544; H01L 2224/80644; H01L 2224/80744; H01L 2224/81444;
(Continued)

(56) References Cited

U.S. PATENT DOCUMENTS

| | | | | |
|---|---|---|---|---|
| 4,404,453 A | * | 9/1983 | Gotman | B23K 1/0056 257/E21.511 |
| 6,284,998 B1 | * | 9/2001 | Sinkunas | B23K 1/0056 219/121.64 |

(Continued)

OTHER PUBLICATIONS

Oppermann, H. et al., "Nanoporous interconnects," 3rd Electronics System Integration Technology Conference ESTC, Sep. 2010, 4 pages.

*Primary Examiner* — Scott B Geyer
(74) *Attorney, Agent, or Firm* — Fenwick & West LLP

(57) ABSTRACT

Embodiments relate to using nanoporous metal tips to establish connections between a first body and a second body. The first body is positioned relative to the second body to align contacts protruding from a first surface of the first body with electrodes protruding from a second surface of the second body. The second surface faces the first surface. The contacts, the electrodes, or both comprise nanoporous metal tips. A relative movement is made between the first body and the second body after positioning the first body to approach the first body to the second body. The contacts and the electrodes are bonded by melting and solidifying the nanoporous metal tips after approaching the first body and the second body.

10 Claims, 12 Drawing Sheets

(51) Int. Cl.
  *H01L 25/00* (2006.01)
  *H01L 25/16* (2006.01)
(52) U.S. Cl.
  CPC ............ *H01L 2224/8012* (2013.01); *H01L 2224/80203* (2013.01); *H01L 2224/80224* (2013.01); *H01L 2224/80815* (2013.01); *H01L 2224/80895* (2013.01); *H01L 2224/81009* (2013.01); *H01L 2224/8112* (2013.01); *H01L 2224/81203* (2013.01); *H01L 2224/81895* (2013.01); *H01L 2924/12041* (2013.01)
(58) Field of Classification Search
  CPC . H01L 2224/81544; H01L 2224/81644; H01L 2224/81744
  See application file for complete search history.

(56) References Cited

U.S. PATENT DOCUMENTS

| | | | | |
|---|---|---|---|---|
| 6,867,124 B1* | 3/2005 | Clemons | ............... | H01L 24/81 257/E23.079 |
| 10,566,214 B1* | 2/2020 | Goward | ............... | C23C 14/14 |
| 2003/0217996 A1* | 11/2003 | Steur | ............... | B23K 1/0056 257/E21.511 |
| 2013/0134396 A1* | 5/2013 | Shimomura | ............ | C03B 23/203 428/61 |
| 2013/0270230 A1* | 10/2013 | Cheung | ............... | H01L 24/75 228/180.21 |
| 2014/0061921 A1* | 3/2014 | Basavanhally | ......... | H01L 24/11 438/654 |
| 2015/0221602 A1* | 8/2015 | Aliane | ............... | H01L 23/145 438/108 |
| 2016/0049381 A1* | 2/2016 | Ryu | ............... | H05K 3/3494 438/125 |
| 2016/0192496 A1* | 6/2016 | Wang | ............... | H01L 24/92 361/767 |
| 2018/0019191 A1* | 1/2018 | Uzoh | ............... | H01L 24/03 |
| 2018/0374738 A1* | 12/2018 | Lee | ............... | H01L 24/75 |
| 2019/0043843 A1* | 2/2019 | Liu | ............... | H01L 24/00 |
| 2019/0279958 A1* | 9/2019 | Chen | ............... | H01L 23/49822 |
| 2019/0348392 A1* | 11/2019 | Chen | ............... | H01L 24/98 |
| 2020/0111939 A1* | 4/2020 | Brodoceanu | ............ | H01L 33/56 |
| 2020/0135996 A1* | 4/2020 | Liao | ............... | H01L 24/81 |
| 2020/0243478 A1* | 7/2020 | Hsieh | ............... | H01L 25/167 |
| 2021/0335752 A1* | 10/2021 | Huang | ............... | H01L 24/94 |

* cited by examiner

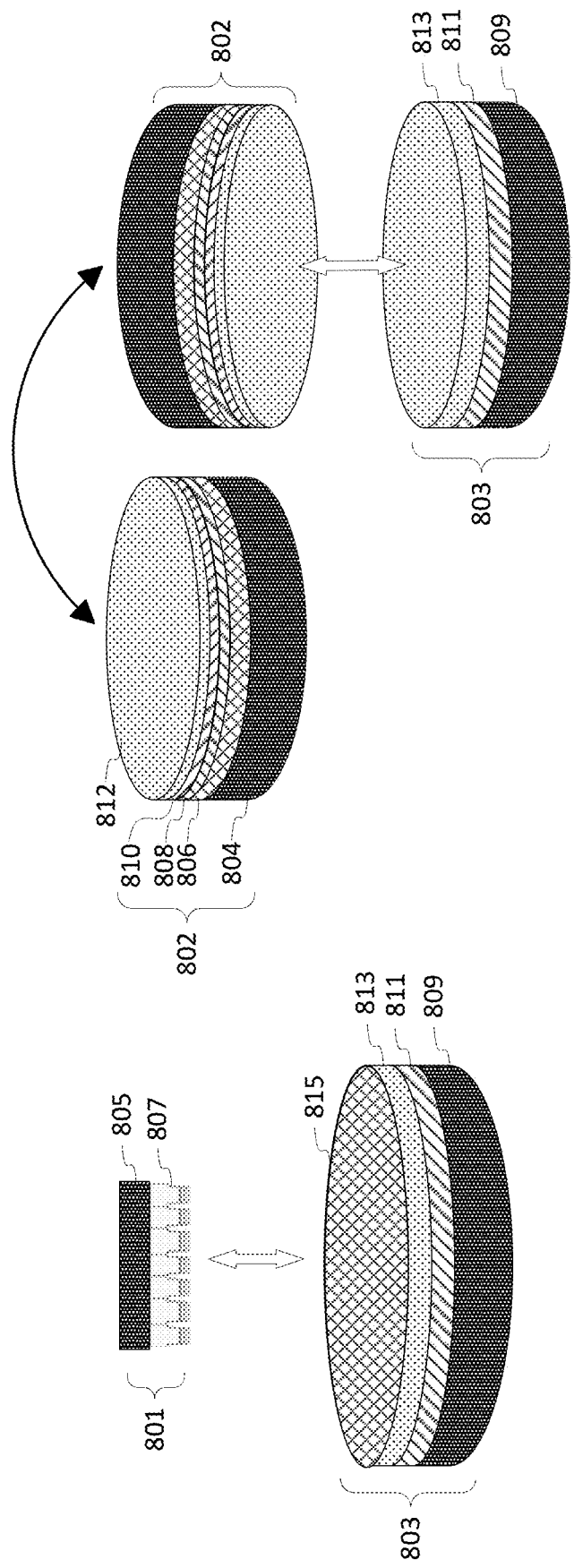

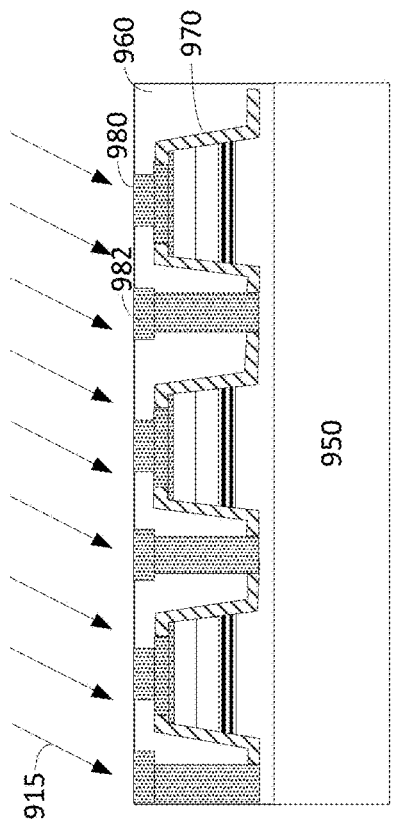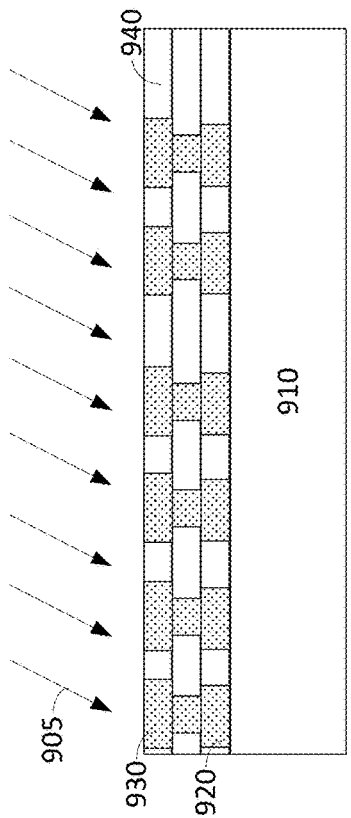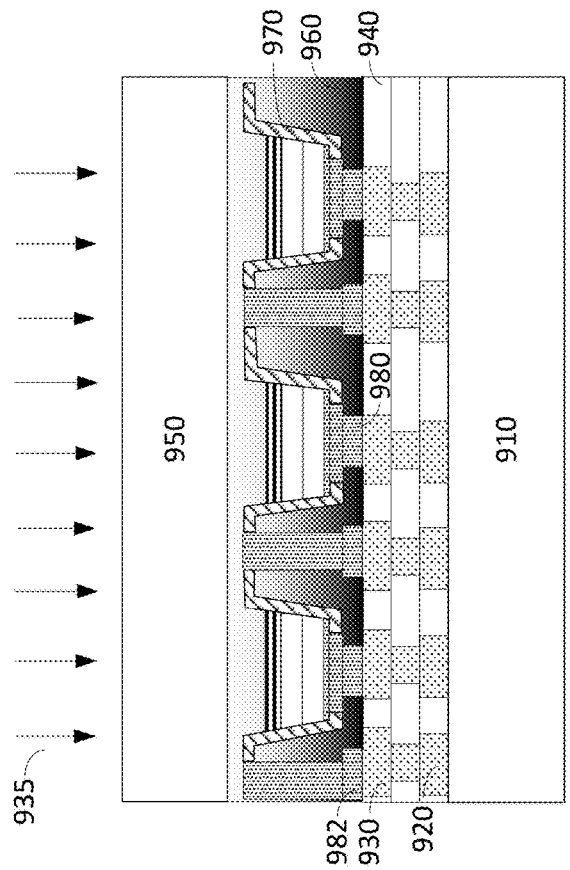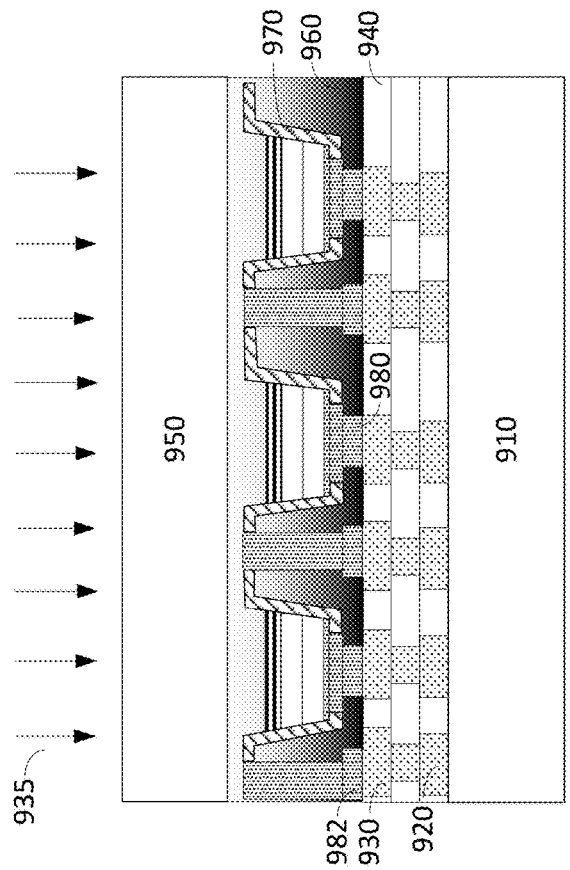

Position a first body relative to a second body to align contacts protruding from a first surface of the first body with electrodes protruding from a second surface of the second body facing the first surface
1210

Approach the first body and the second body so that the contacts and the electrodes are separated by less than a predetermined distance
1220

Bonding the contacts with corresponding electrodes by melting and solidifying nanoporous metal tips
1230

FIG. 12

HYBRID INTERCONNECT FOR LASER BONDING USING NANOPOROUS METAL TIPS

CROSS-REFERENCE TO RELATED APPLICATION

This application claims the benefit of U.S. Provisional Application No. 62/913,645 filed Oct. 10, 2019, which is incorporated by reference in its entirety.

FIELD OF THE INVENTION

This disclosure relates generally to micro light emitting diodes (micro-LEDs) for a display, and more specifically to establishing hybrid interconnections between micro-LEDs and control circuits in display devices using nanoporous metal tips.

BACKGROUND

Various types of light sources are used in many electronic display devices, such as televisions, computer monitors, laptop computers, tablets, smartphones, projection systems, and head-mounted devices (e.g., virtual reality (VR) devices, augmented reality (AR) devices, and/or mixed-reality (MR) devices). Modern displays may include well over ten million individual light sources that may be arranged in rows and columns on one or more backplanes. When assembling the display, it is typically required to electrically couple, bond, or affix (i.e., establish an interconnection with) each of the light sources to the backplane.

SUMMARY

Embodiments relate to a hybrid interconnection for laser bonding of a first body to a second body using nanoporous metal tips. The first body has a first surface with contacts protruding from the first surface. The second body has a second surface with corresponding electrodes protruding from the second surface. The second surface faces the first surface. The contacts, the electrodes, or both comprise nanoporous metal tips. The contacts bond with corresponding electrodes by melting and solidifying the nanoporous metal tips.

Embodiments also relate to using nanoporous metal tips to establish connections between a first body and a second body. The first body is positioned relative to the second body to align contacts protruding from a first surface of the first body with electrodes protruding from a second surface of the second body. The second surface faces the first surface. The contacts, the electrodes, or both comprise nanoporous metal tips. A relative movement is made between the first body and the second body after positioning the first body to approach the first body to the second body. The contacts and the electrodes are bonded by melting and solidifying the nanoporous metal tips after approaching the first body and the second body.

BRIEF DESCRIPTION OF THE DRAWINGS

FIG. 8A illustrates a method of die-to-wafer bonding for arrays of LEDs, in accordance with one or more embodiments.

FIG. 8B illustrates a method of wafer-to-wafer bonding for arrays of LEDs, in accordance with one or more embodiments.

FIGS. 9A-9D illustrates a method of hybrid bonding for arrays of LEDs, in accordance with one or more embodiments.

FIG. 12 is a flowchart illustrating a process for interconnecting a first body to a second body via contact and electrodes using nanoporous metal tips, in accordance with one or more embodiments.

The figures depict various embodiments for purposes of illustration only. One skilled in the art will readily recognize from the following discussion that alternative embodiments of the structures and methods illustrated herein may be employed without departing from the principles described herein.

DETAILED DESCRIPTION

Embodiments relate to a hybrid interconnection for bonding electrodes with corresponding contacts using nanoporous metal tips. The contacts, the electrodes, or both have nanoporous metal tips. The contacts bond with corresponding electrodes by melting and solidifying the nanoporous metal tips. The contacts and/or the electrodes are heated so that nanoporous metal at the tip may melt to have spherical surfaces. By having the nanoporous metal located only at the tips of the contacts and/or the electrodes, the resulting interconnection after the laser bonding takes place between the contacts and the electrodes has less variations and reduces the likelihood of creating a short. For instance, a contact and/or electrode comprised of nanoporous metal (i.e., nanoporous metal located throughout the entire contact and/or electrode) may convert from a cylindrical shape to a spherical droplet upon laser bonding. The volume and shape change may result in significant height variations that may lead to bonding failure (e.g., shorts or opens).

Figure 1:
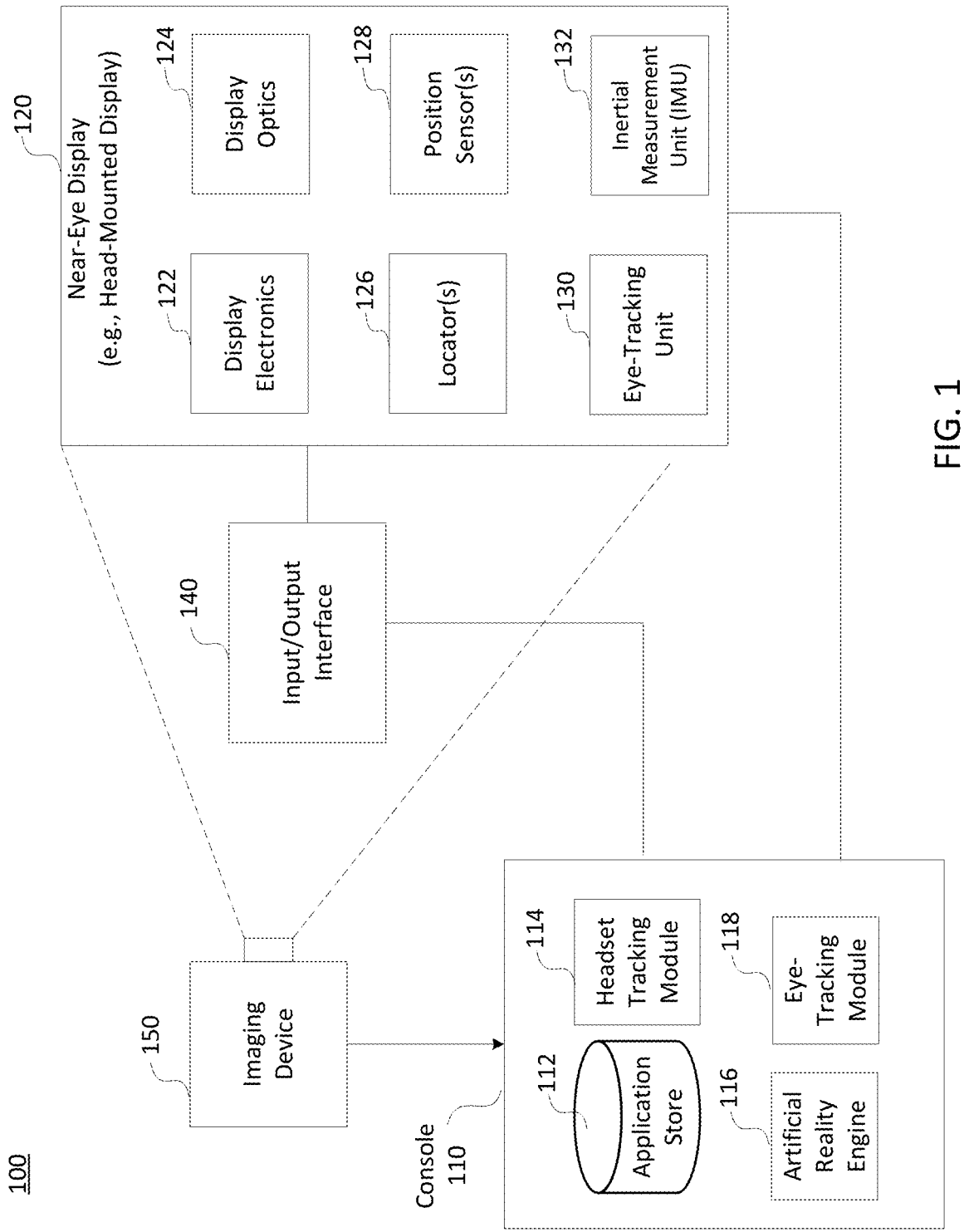
FIG. 1 is a block diagram of an artificial reality system including a near-eye display, in accordance with one or more embodiments.

FIG. 1 is a block diagram of an artificial reality system 100 including a near-eye display 120, in accordance with one or more embodiments. The artificial reality system environment 100 shown in FIG. 1 may include the near-eye display 120, an optional external imaging device 150, and an optional input/output interface 140, each of which may be coupled to an optional console 110. While FIG. 1 shows an example of the artificial reality system environment 100 including one near-eye display 120, one external imaging device 150, and one input/output interface 140, any number of these components may be included in the artificial reality system environment 100, or any of the components may be omitted. For example, there may be multiple near-eye displays 120 monitored by one or more external imaging devices 150 in communication with a console 110. In some configurations, the artificial reality system environment 100 may not include the external imaging device 150, the optional input/output interface 140, and the optional console 110. In alternative configurations, different or additional components may be included in the artificial reality system environment 100.

The near-eye display 120 may be a head-mounted display that presents content to a user. Examples of content presented by the near-eye display 120 include one or more of images, videos, audio, or any combination thereof. In some embodiments, audio may be presented via an external device (e.g., speakers and/or headphones) that receives audio information from the near-eye display 120, the console 110, or both, and presents audio data based on the audio information. The near-eye display 120 may include one or more rigid bodies, which may be rigidly or non-rigidly coupled to each other. A rigid coupling between rigid bodies may cause the coupled rigid bodies to act as a single rigid entity. A non-rigid coupling between rigid bodies may allow the rigid bodies to move relative to each other. In various embodiments, the near-eye display 120 may be implemented in any suitable form-factor, including a pair of glasses. Some embodiments of the near-eye display 120 are further described below with respect to FIGS. 2 and 3. Additionally, in various embodiments, the functionality described herein may be used in a headset that combines images of an environment external to the near-eye display 120 and artificial reality content (e.g., computer-generated images). Therefore, the near-eye display 120 may augment images of a physical, real-world environment external to the near-eye display 120 with generated content (e.g., images, video, sound, etc.) to present an augmented reality to a user.

In various embodiments, the near-eye display 120 may include one or more of display electronics 122, display optics 124, and an eye-tracking unit 130. In some embodiments, the near-eye display 120 may also include one or more locators 126, one or more position sensors 128, and an inertial measurement unit (IMU) 132. The near-eye display 120 may omit any of the eye-tracking unit 130, the locators 126, the position sensors 128, and the IMU 132, or include additional elements in various embodiments. Additionally, in some embodiments, the near-eye display 120 may include elements combining the function of various elements described in conjunction with FIG. 1.

The display electronics 122 may display or facilitate the display of images to the user according to data received from, for example, the console 110. In various embodiments, the display electronics 122 may include one or more display panels, such as a liquid crystal display (LCD), an organic light emitting diode (OLED) display, an inorganic light emitting diode (ILED) display, a micro light emitting diode (micro-LED) display, an active-matrix OLED display (AMOLED), a transparent OLED display (TOLED), or some other display. For example, in one implementation of the near-eye display 120, the display electronics 122 may include a front TOLED panel, a rear display panel, and an optical component (e.g., an attenuator, polarizer, or diffractive or spectral film) between the front and rear display panels. The display electronics 122 may include pixels to emit light of a predominant color such as red, green, blue, white, or yellow. In some implementations, the display electronics 122 may display a three-dimensional (3D) image through stereoscopic effects produced by two-dimensional (2D) panels to create a subjective perception of image depth. For example, the display electronics 122 may include a left display and a right display positioned in front of a user's left eye and right eye, respectively. The left and right displays may present copies of an image shifted horizontally relative to each other to create a stereoscopic effect (i.e., a perception of image depth by a user viewing the image).

In certain embodiments, the display optics 124 may display image content optically (e.g., using optical waveguides and couplers) or magnify image light received from the display electronics 122, correct optical errors associated with the image light, and present the corrected image light to a user of the near-eye display 120. In various embodiments, the display optics 124 may include one or more optical elements, such as, for example, a substrate, optical waveguides, an aperture, a Fresnel lens, a convex lens, a concave lens, a filter, input/output couplers, or any other suitable optical elements that may affect image light emitted from the display electronics 122. The display optics 124 may include a combination of different optical elements as well as mechanical couplings to maintain relative spacing and orientation of the optical elements in the combination. One or more optical elements in the display optics 124 may have an optical coating, such as an anti-reflective coating, a reflective coating, a filtering coating, or a combination of different optical coatings.

Magnification of the image light by the display optics 124 may allow the display electronics 122 to be physically smaller, weigh less, and consume less power than larger displays. Additionally, magnification may increase a field of view of the displayed content. The amount of magnification of image light by the display optics 124 may be changed by adjusting, adding, or removing optical elements from the display optics 124. In some embodiments, the display optics 124 may project displayed images to one or more image planes that may be further away from the user's eyes than the near-eye display 120.

The display optics 124 may also be designed to correct one or more types of optical errors, such as 2D optical errors, 3D optical errors, or any combination thereof. Two-dimensional errors may include optical aberrations that occur in two dimensions. Example types of 2D errors may include barrel distortion, pincushion distortion, longitudinal chromatic aberration, and transverse chromatic aberration. Three-dimensional errors may include optical errors that occur in three dimensions. Example types of 3D errors may include spherical aberration, comatic aberration, field curvature, and astigmatism.

The locators 126 may be objects located in specific positions on the near-eye display 120 relative to one another and relative to a reference point on the near-eye display 120. In some implementations, the console 110 may identify the locators 126 in images captured by the external imaging device 150 to determine the artificial reality headset's position, orientation, or both. A locator 126 may be an LED, a corner cube reflector, a reflective marker, a type of light source that contrasts with an environment in which the near-eye display 120 operates, or any combination thereof. In embodiments where the locators 126 are active components (e.g., LEDs or other types of light emitting devices), the locators 126 may emit light in the visible band (e.g., about 380 nm to 750 nm), in the infrared (IR) band (e.g., about 750 nm to 1 mm), in the ultraviolet band (e.g., about 10 nm to about 380 nm), in another portion of the electromagnetic spectrum, or in any combination of portions of the electromagnetic spectrum.

The external imaging device 150 may include one or more cameras, one or more video cameras, any other device capable of capturing images including one or more of the locators 126, or any combination thereof. Additionally, the external imaging device 150 may include one or more filters (e.g., to increase signal to noise ratio). The external imaging device 150 may be configured to detect light emitted or reflected from the locators 126 in a field of view of the external imaging device 150. In embodiments where the locators 126 include passive elements (e.g., retroreflectors), the external imaging device 150 may include a light source that illuminates some or all of the locators 126, which may retro-reflect the light to the light source in the external imaging device 150. Slow calibration data may be communicated from the external imaging device 150 to the console 110, and the external imaging device 150 may receive one or more calibration parameters from the console 110 to adjust one or more imaging parameters (e.g., focal length, focus, frame rate, sensor temperature, shutter speed, aperture, etc.).

The position sensors 128 may generate one or more measurement signals in response to motion of the near-eye display 120. Examples of position sensors 128 may include accelerometers, gyroscopes, magnetometers, other motion-detecting or error-correcting sensors, or any combination thereof. For example, in some embodiments, the position sensors 128 may include multiple accelerometers to measure translational motion (e.g., forward/back, up/down, or left/right) and multiple gyroscopes to measure rotational motion (e.g., pitch, yaw, or roll). In some embodiments, various position sensors may be oriented orthogonally to each other.

The IMU 132 may be an electronic device that generates fast calibration data based on measurement signals received from one or more of the position sensors 128. The position sensors 128 may be located external to the IMU 132, internal to the IMU 132, or any combination thereof. Based on the one or more measurement signals from one or more position sensors 128, the IMU 132 may generate fast calibration data indicating an estimated position of the near-eye display 120 relative to an initial position of the near-eye display 120. For example, the IMU 132 may integrate measurement signals received from accelerometers over time to estimate a velocity vector and integrate the velocity vector over time to determine an estimated position of a reference point on the near-eye display 120. Alternatively, the IMU 132 may provide the sampled measurement signals to the console 110, which may determine the fast calibration data. While the reference point may generally be defined as a point in space, in various embodiments, the reference point may also be defined as a point within the near-eye display 120 (e.g., a center of the IMU 132).

The eye-tracking unit 130 may include one or more eye-tracking systems. Eye tracking may refer to determining an eye's position, including orientation and location of the eye, relative to the near-eye display 120. An eye-tracking system may include an imaging system to image one or more eyes and may optionally include a light emitter, which may generate light that is directed to an eye such that light reflected by the eye may be captured by the imaging system. For example, the eye-tracking unit 130 may include a non-coherent or coherent light source (e.g., a laser diode) emitting light in the visible spectrum or infrared spectrum, and a camera capturing the light reflected by the user's eye. As another example, the eye-tracking unit 130 may capture reflected radio waves emitted by a miniature radar unit. The eye-tracking unit 130 may use low-power light emitters that emit light at frequencies and intensities that would not injure the eye or cause physical discomfort. The eye-tracking unit 130 may be arranged to increase contrast in images of an eye captured by the eye-tracking unit 130 while reducing the overall power consumed by the eye-tracking unit 130 (e.g., reducing power consumed by a light emitter and an imaging system included in the eye-tracking unit 130). For example, in some implementations, the eye-tracking unit 130 may consume less than 100 milliwatts of power.

The near-eye display 120 may use the orientation of the eye to, e.g., determine an inter-pupillary distance (IPD) of the user, determine gaze direction, introduce depth cues (e.g., blur image outside of the user's main line of sight), collect heuristics on the user interaction in the VR media (e.g., time spent on any particular subject, object, or frame as a function of exposed stimuli), some other functions that are based in part on the orientation of at least one of the user's eyes, or any combination thereof. Because the orientation may be determined for both eyes of the user, the eye-tracking unit 130 may be able to determine where the user is looking. For example, determining a direction of a user's gaze may include determining a point of convergence based on the determined orientations of the user's left and right eyes. A point of convergence may be the point where the two foveal axes of the user's eyes intersect. The direction of the user's gaze may be the direction of a line passing through the point of convergence and the mid-point between the pupils of the user's eyes.

The input/output interface 140 may be a device that allows a user to send action requests to the console 110. An action request may be a request to perform a particular action. For example, an action request may be to start or to end an application or to perform a particular action within the application. The input/output interface 140 may include one or more input devices. Example input devices may include a keyboard, a mouse, a game controller, a glove, a button, a touch screen, or any other suitable device for receiving action requests and communicating the received action requests to the console 110. An action request received by the input/output interface 140 may be communicated to the console 110, which may perform an action corresponding to the requested action. In some embodiments, the input/output interface 140 may provide haptic feedback to the user in accordance with instructions received from the console 110. For example, the input/output interface 140 may provide haptic feedback when an action request is received, or when the console 110 has performed a requested action and communicates instructions to the input/output interface 140. In some embodiments, the external imaging device 150 may be used to track the input/output interface 140, such as tracking the location or position of a controller (which may include, for example, an IR light source) or a hand of the user to determine the motion of the user. In some embodiments, the near-eye display 120 may include one or more imaging devices to track the input/ output interface 140, such as tracking the location or position of a controller or a hand of the user to determine the motion of the user.

The console 110 may provide content to the near-eye display 120 for presentation to the user in accordance with information received from one or more of the external imaging device 150, the near-eye display 120, and the input/output interface 140. In the example shown in FIG. 1, the console 110 may include an application store 112, a headset tracking module 114, an artificial reality engine 116, and an eye-tracking module 118. Some embodiments of the console 110 may include different or additional modules than those described in conjunction with FIG. 1. Functions further described below may be distributed among components of the console 110 in a different manner than is described here.

In some embodiments, the console 110 may include a processor and a non-transitory computer-readable storage medium storing instructions executable by the processor. The processor may include multiple processing units executing instructions in parallel. The non-transitory computer-readable storage medium may be any memory, such as a hard disk drive, a removable memory, or a solid-state drive (e.g., flash memory or dynamic random access memory (DRAM)). In various embodiments, the modules of the console 110 described in conjunction with FIG. 1 may be encoded as instructions in the non-transitory computer-readable storage medium that, when executed by the processor, cause the processor to perform the functions further described below.

The application store 112 may store one or more applications for execution by the console 110. An application may include a group of instructions that, when executed by a processor, generates content for presentation to the user. Content generated by an application may be in response to inputs received from the user via movement of the user's eyes or inputs received from the input/output interface 140. Examples of the applications may include gaming applications, conferencing applications, video playback application, or other suitable applications.

The headset tracking module 114 may track movements of the near-eye display 120 using slow calibration information from the external imaging device 150. For example, the headset tracking module 114 may determine positions of a reference point of the near-eye display 120 using observed locators from the slow calibration information and a model of the near-eye display 120. The headset tracking module 114 may also determine positions of a reference point of the near-eye display 120 using position information from the fast calibration information. Additionally, in some embodiments, the headset tracking module 114 may use portions of the fast calibration information, the slow calibration information, or any combination thereof, to predict a future location of the near-eye display 120. The headset tracking module 114 may provide the estimated or predicted future position of the near-eye display 120 to the artificial reality engine 116.

The artificial reality engine 116 may execute applications within the artificial reality system environment 100 and receive position information of the near-eye display 120, acceleration information of the near-eye display 120, velocity information of the near-eye display 120, predicted future positions of the near-eye display 120, or any combination thereof from the headset tracking module 114. The artificial reality engine 116 may also receive estimated eye position and orientation information from the eye-tracking module 118. Based on the received information, the artificial reality engine 116 may determine content to provide to the near-eye display 120 for presentation to the user. For example, if the received information indicates that the user has looked to the left, the artificial reality engine 116 may generate content for the near-eye display 120 that mirrors the user's eye movement in a virtual environment. Additionally, the artificial reality engine 116 may perform an action within an application executing on the console 110 in response to an action request received from the input/output interface 140, and provide feedback to the user indicating that the action has been performed. The feedback may be visual or audible feedback via the near-eye display 120 or haptic feedback via the input/output interface 140.

The eye-tracking module 118 may receive eye-tracking data from the eye-tracking unit 130 and determine the position of the user's eye based on the eye tracking data. The position of the eye may include an eye's orientation, location, or both relative to the near-eye display 120 or any element thereof. Because the eye's axes of rotation change as a function of the eye's location in its socket, determining the eye's location in its socket may allow the eye-tracking module 118 to more accurately determine the eye's orientation.

Figure 2:
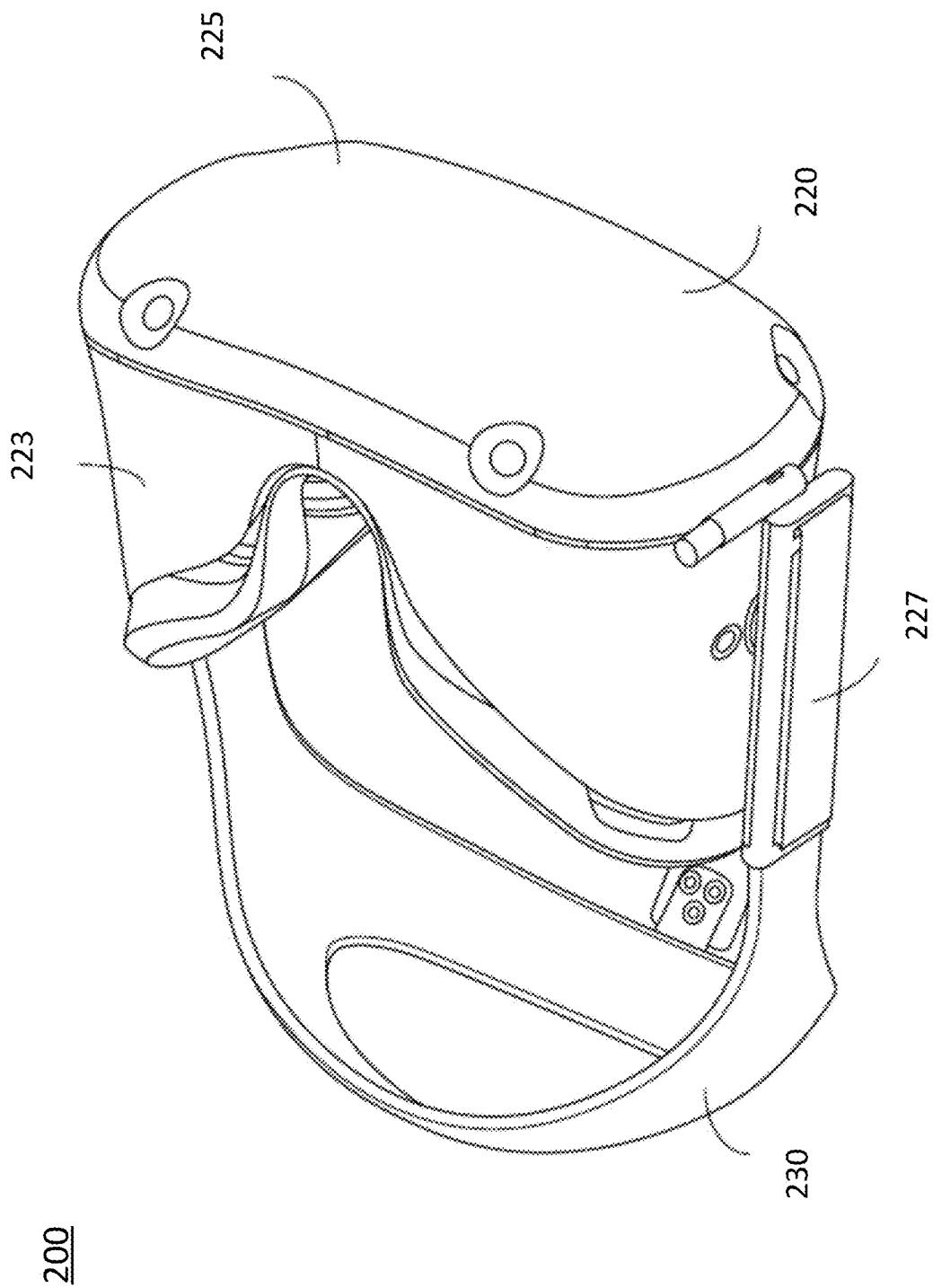
FIG. 2 is a perspective view of a near-eye display in the form of a head-mounted display (HMD) device, in accordance with one or more embodiments.

FIG. 2 is a perspective view of a near-eye display in the form of a head-mounted display (HMD) device 200, in accordance with one or more embodiments. The HMD device 200 may be a part of, e.g., a VR system, an AR system, an MR system, or any combination thereof. The HMD device 200 may include a body 220 and a head strap 230. FIG. 2 shows a bottom side 223, a front side 225, and a left side 227 of the body 220 in the perspective view. The head strap 230 may have an adjustable or extendible length. There may be a sufficient space between the body 220 and the head strap 230 of the HMD device 200 for allowing a user to mount the HMD device 200 onto the user's head. In various embodiments, the HMD device 200 may include additional, fewer, or different components. For example, in some embodiments, the HMD device 200 may include eyeglass temples and temple tips as shown in, for example, FIG. 3 below, rather than the head strap 230.

The HMD device 200 may present to a user media including virtual and/or augmented views of a physical, real-world environment with computer-generated elements. Examples of the media presented by the HMD device 200 may include images (e.g., 2D or 3D images), videos (e.g., 2D or 3D videos), audio, or any combination thereof. The images and videos may be presented to each eye of the user by one or more display assemblies (not shown in FIG. 2) enclosed in the body 220 of the HMD device 200. In various embodiments, the one or more display assemblies may include a single electronic display panel or multiple electronic display panels (e.g., one display panel for each eye of the user). Examples of the electronic display panel(s) may include, for example, an LCD, an OLED display, an ILED display, a micro-LED display, an AMOLED, a TOLED, some other display, or any combination thereof. The HMD device 200 may include two eye box regions.

In some implementations, the HMD device 200 may include various sensors (not shown), such as depth sensors, motion sensors, position sensors, and eye tracking sensors. Some of these sensors may use a structured light pattern for sensing. In some implementations, the HMD device 200 may include an input/output interface for communicating with a console. In some implementations, the HMD device 200 may include a virtual reality engine (not shown) that can execute applications within the HMD device 200 and receive depth information, position information, acceleration information, velocity information, predicted future positions, or any combination thereof of the HMD device 200 from the various sensors. In some implementations, the information received by the virtual reality engine may be used for producing a signal (e.g., display instructions) to the one or more display assemblies. In some implementations, the HMD device 200 may include locators (not shown, such as the locators 126) located in fixed positions on the body 220 relative to one another and relative to a reference point. Each of the locators may emit light that is detectable by an external imaging device.

Figure 3:
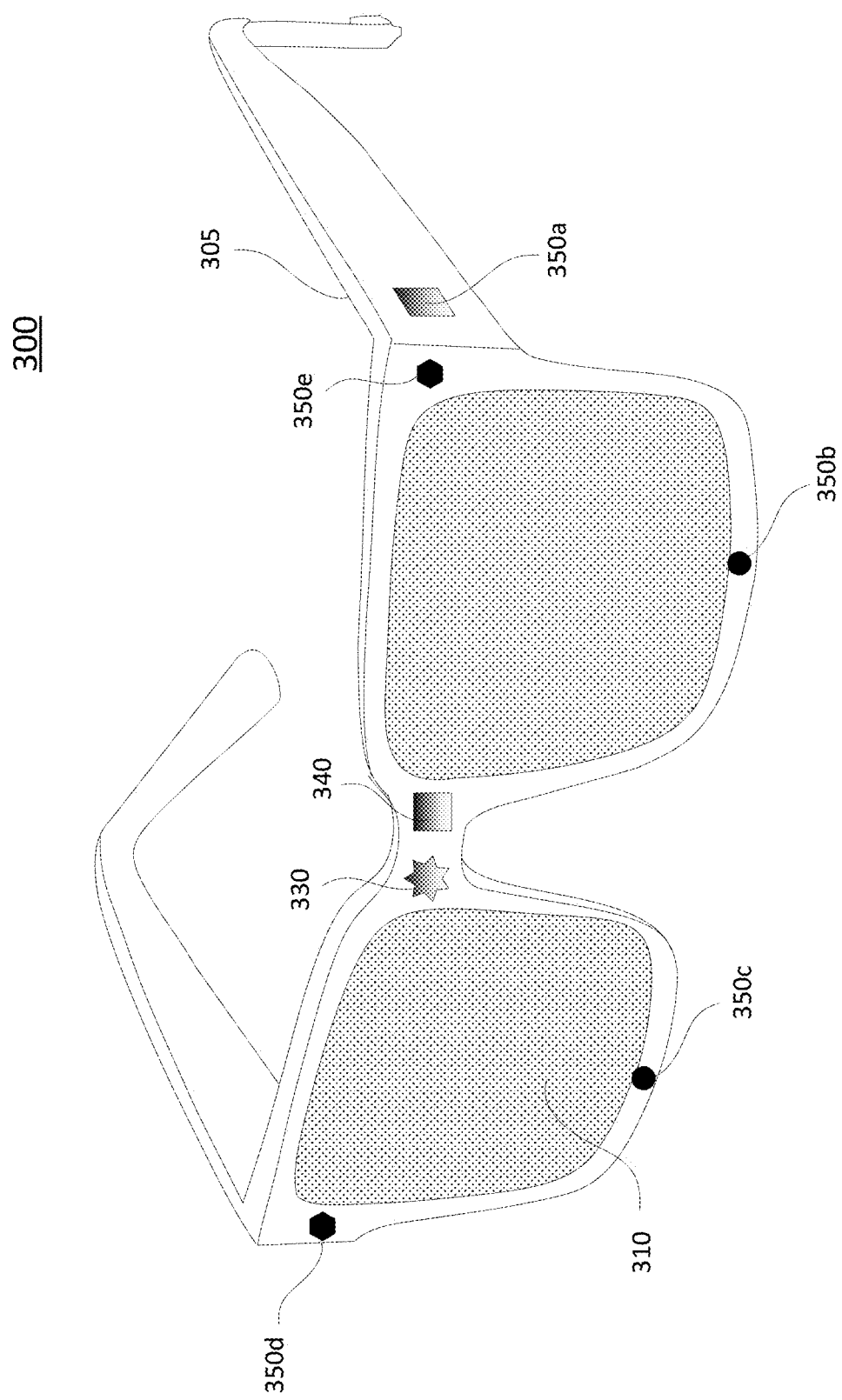
FIG. 3 is a perspective view of a near-eye display in the form of a pair of glasses, in accordance with one or more embodiments.

FIG. 3 is a perspective view of a near-eye display 300 in the form of a pair of glasses, in accordance with one or more embodiments. The near-eye display 300 may be a specific implementation of the near-eye display 120 of FIG. 1, and may be configured to operate as a VR display, an AR display, and/or a MR display. The near-eye display 300 may include a frame 305 and a display 310. The display 310 may be configured to present content to a user. In some embodiments, the display 310 may include display electronics and/or display optics. For example, as described above with respect to the near-eye display 120 of FIG. 1, the display 310 may include an LCD display panel, an LED display panel, or an optical display panel (e.g., a waveguide display assembly).

The near-eye display 300 may further include various sensors 350*a*, 350*b*, 350*c*, 350*d*, and 350*e* on or within the frame 305. In some embodiments, the sensors 350*a*-350*e* may include one or more depth sensors, motion sensors, position sensors, inertial sensors, or ambient light sensors. In some embodiments, the sensors 350*a*-350*e* may include one or more image sensors configured to generate image data representing different fields of views in different directions. In some embodiments, the sensors 350*a*-350*e* may be used as input devices to control or influence the displayed content of the near-eye display 300, and/or to provide an interactive VR/AR/MR experience to a user of the near-eye display 300. In some embodiments, the sensors 350*a*-350*e* may also be used for stereoscopic imaging.

In some embodiments, the near-eye display 300 may further include one or more illuminators 330 to project light into the physical environment. The projected light may be associated with different frequency bands (e.g., visible light, infra-red light, ultra-violet light, etc.), and may serve various purposes. For example, the illuminator(s) 330 may project light in a dark environment (or in an environment with low intensity of infra-red light, ultra-violet light, etc.) to assist the sensors 350*a*-350*e* in capturing images of different objects within the dark environment. In some embodiments, the illuminator(s) 330 may be used to project certain light pattern onto the objects within the environment. In some embodiments, the illuminator(s) 330 may be used as locators, such as the locators 126 described above with respect to FIG. 1.

In some embodiments, the near-eye display 300 may also include a high-resolution camera 340. The camera 340 may capture images of the physical environment in the field of view. The captured images may be processed, for example, by a virtual reality engine (e.g., the artificial reality engine 116 of FIG. 1) to add virtual objects to the captured images or modify physical objects in the captured images, and the processed images may be displayed to the user by the display 310 for AR or MR applications.

Figure 4:
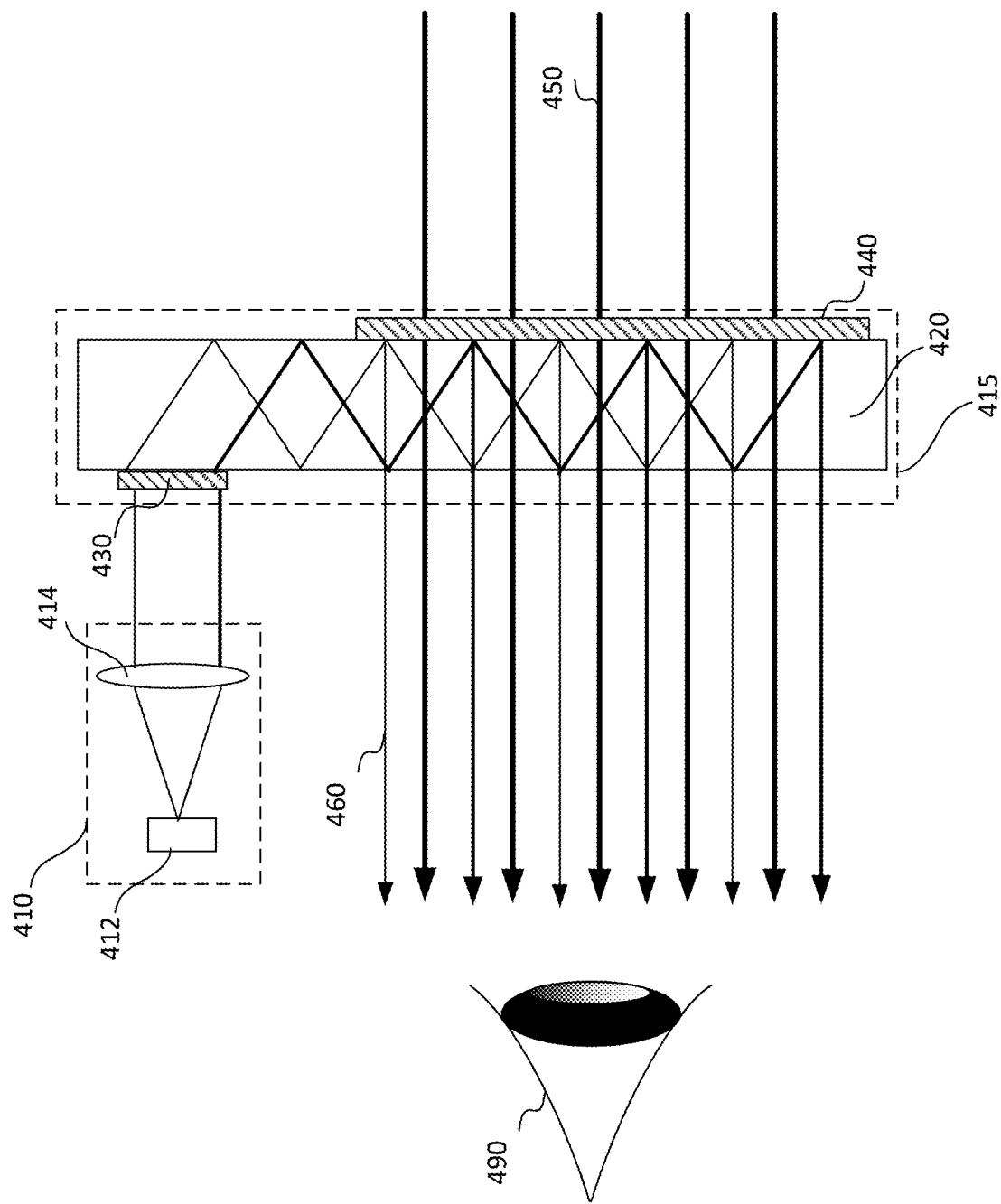
FIG. 4 illustrates an optical see-through augmented reality system including a waveguide display, in accordance with one or more embodiments.

FIG. 4 illustrates an optical see-through augmented reality system 400 including a waveguide display, in accordance with one or more embodiments. The augmented reality system 400 may include a projector 410 and a combiner 415.

The projector 410 may include a light source or image source 412 and projector optics 414. In some embodiments, the light source or image source 412 may include one or more micro-LED devices described above. In some embodiments, the image source 412 may include a plurality of pixels that displays virtual objects, such as an LCD display panel or an LED display panel. In some embodiments, the light source 412 may include a light source that generates coherent or partially coherent light. For example, the light source 412 may include a laser diode, a vertical cavity surface emitting laser, an LED, and/or a micro-LED described above. In some embodiments, the light source 412 may include a plurality of light sources (e.g., an array of micro-LEDs described above) each emitting a monochromatic image light corresponding to a primary color (e.g., red, green, or blue). In some embodiments, the light source 412 may include three 2D arrays of micro-LEDs, where each 2D array of micro-LEDs may include micro-LEDs configured to emit light of a primary color (e.g., red, green, or blue). In some embodiments, the light source 412 may include an optical pattern generator, such as a spatial light modulator. The projector optics 414 may include one or more optical components that can condition the light from the light source 412, such as expanding, collimating, scanning, or projecting light from the light source 412 to the combiner 415. The one or more optical components may include, for example, one or more lenses, liquid lenses, mirrors, apertures, and/or gratings. For example, in some embodiments, the light source 412 may include one or more one-dimensional arrays or elongated 2D arrays of micro-LEDs, and the projector optics 414 may include one or more one-dimensional scanners (e.g., micro-mirrors or prisms) configured to scan the one-dimensional arrays or elongated 2D arrays of micro-LEDs to generate image frames. In some embodiments, the projector optics 414 may include a liquid lens (e.g., a liquid crystal lens) with a plurality of electrodes that allows scanning of the light from the light source 412.

The combiner 415 may include an input coupler 430 for coupling light from the projector 410 into a substrate 420 of the combiner 415. The combiner 415 may transmit at least 50% of light in a first wavelength range and reflect at least 25% of light in a second wavelength range. For example, the first wavelength range may be visible light from about 400 nm to about 650 nm, and the second wavelength range may be in the infrared band, for example, from about 800 nm to about 1000 nm. The input coupler 430 may include a volume holographic grating, a diffractive optical element (DOE) (e.g., a surface-relief grating), a slanted surface of the substrate 420, or a refractive coupler (e.g., a wedge or a prism). The input coupler 430 may have a coupling efficiency of greater than 30%, 50%, 75%, 90%, or higher for visible light. Light coupled into the substrate 420 may propagate within the substrate 420 through, for example, total internal reflection (TIR). The substrate 420 may be in the form of a lens of a pair of eyeglasses. The substrate 420 may have a flat or a curved surface, and may include one or more types of dielectric materials, such as glass, quartz, plastic, polymer, poly(methyl methacrylate) (PMMA), crystal, or ceramic. A thickness of the substrate 420 may range from, for example, less than about 1 mm to about 10 mm or more. The substrate 420 may be transparent to visible light.

The substrate 420 may include or may be coupled to a plurality of output couplers 440 configured to extract at least a portion of the light guided by and propagating within the substrate 420 from the substrate 420, and direct extracted light 460 to an eye 490 of the user of the augmented reality system 400. As the input coupler 430, the output couplers 440 may include grating couplers (e.g., volume holographic gratings or surface-relief gratings), other DOEs, prisms, etc. The output couplers 440 may have different coupling (e.g., diffraction) efficiencies at different locations. The substrate 420 may also allow light 450 from the environment in front of the combiner 415 to pass through with little or no loss. The output couplers 440 may also allow the light 450 to pass through with little loss. For example, in some implementations, the output couplers 440 may have a low diffraction efficiency for the light 450 such that the light 450 may be refracted or otherwise pass through the output couplers 440 with little loss, and thus may have a higher intensity than the extracted light 460. In some implementations, the output couplers 440 may have a high diffraction efficiency for the light 450 and may diffract the light 450 to certain desired directions (i.e., diffraction angles) with little loss. As a result, the user may be able to view combined images of the environment in front of the combiner 415 and virtual objects projected by the projector 410.

Figure 5B:
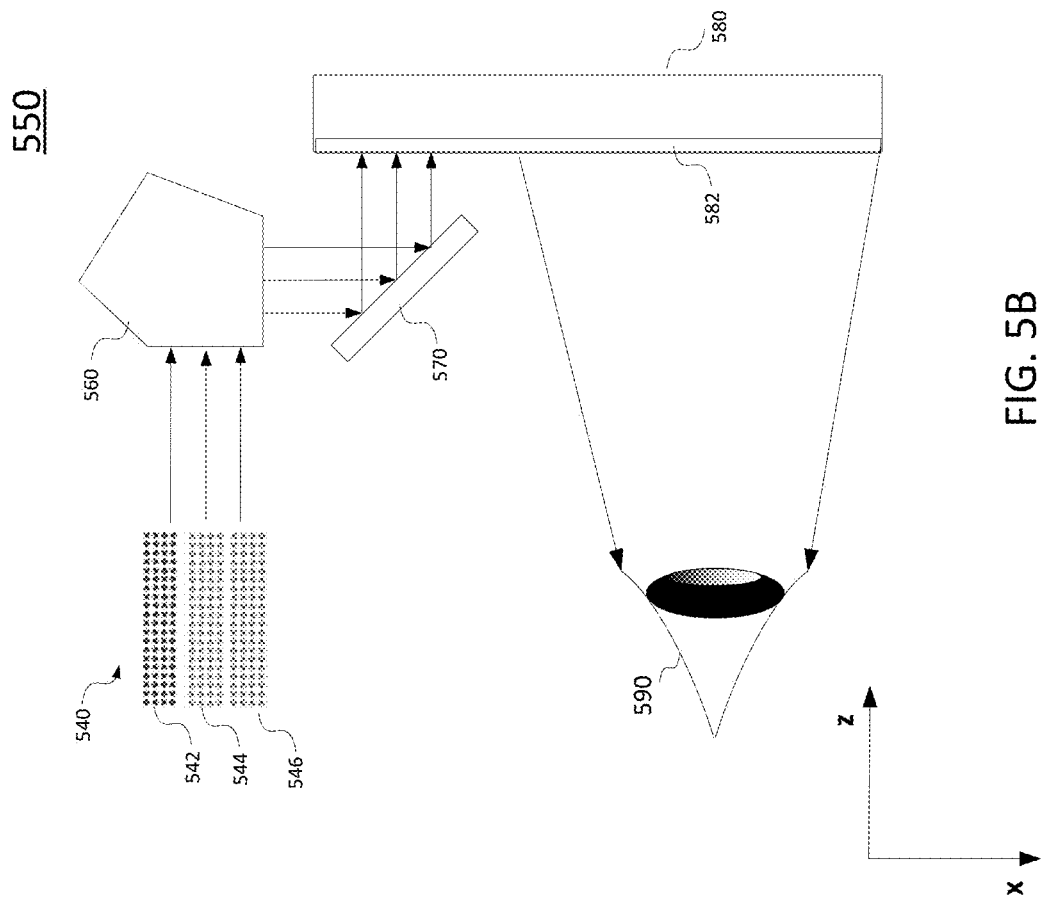
FIG. 5B illustrates an example of a near-eye display device including a waveguide display, in accordance with one or more embodiments.
Figure 5A:
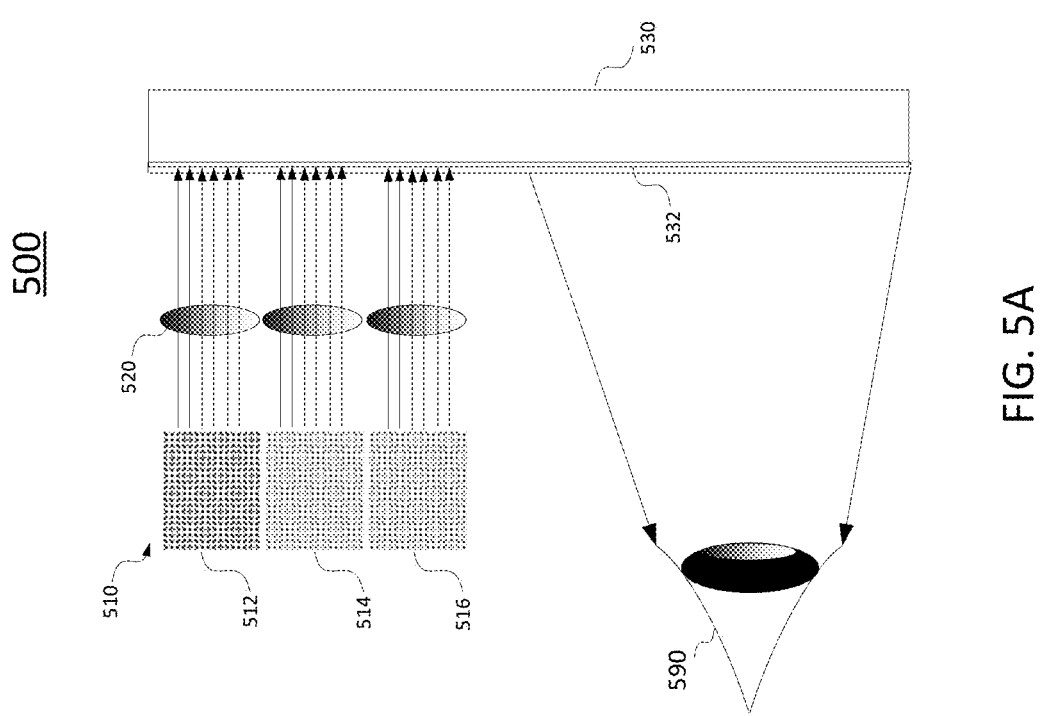
FIG. 5A illustrates an example of a near-eye display device including a waveguide display, in accordance with one or more embodiments.

FIG. 5A illustrates an example of a near-eye display device 500 including a waveguide display 530, in accordance with one or more embodiments. The near-eye display device 500 may be an example of the near-eye display 120, the augmented reality system 400, or another type of display device. The near-eye display device 500 may include a light source 510, projection optics 520, and a waveguide display 530. The light source 510 may include multiple panels of light emitters for different colors, such as a panel of red light emitters 512, a panel of green light emitters 514, and a panel of blue light emitters 516. The red light emitters 512 are organized into an array; the green light emitters 514 are organized into an array; and the blue light emitters 516 are organized into an array. The dimensions and pitches of the light emitters in the light source 510 may be small. For example, each light emitter may have a diameter less than 2 µm (e.g., about 1.2 pm) and the pitch may be less than 2 µm (e.g., about 1.5 µm). As such, the number of light emitters in each of the red light emitters 512, the green light emitters 514, and the blue light emitters 516 can be equal to or greater than the number of pixels in a display image, such as 960×720, 1280×720, 1440×1080, 1920×1080, 2160×1080, or 2560×1080 pixels. Thus, a display image may be generated simultaneously by the light source 510. A scanning element may not be used in the near-eye display device 500.

Before reaching the waveguide display 530, the light emitted by the light source 510 may be conditioned by the projection optics 520, which may include a lens array. The projection optics 520 may collimate or focus the light emitted by the light source 510 to the waveguide display 530, which may include a coupler 532 for coupling the light emitted by the light source 510 into the waveguide display 530. The light coupled into the waveguide display 530 may propagate within the waveguide display 530 through, for example, total internal reflection as described above with respect to FIG. 4. The coupler 532 may also couple portions of the light propagating within the waveguide display 530 out of the waveguide display 530 and towards a user's eye 590.

FIG. 5B illustrates an example of a near-eye display device 550 including a waveguide display 580, in accordance with one or more embodiments. In some embodiments, the near-eye display device 550 may use a scanning mirror 570 to project light from a light source 540 to an image field where a user's eye 590 may be located. The near-eye display device 550 may be an example of the near-eye display 120, the augmented reality system 400, or another type of display device. A light source 540 may include one or more rows or one or more columns of light emitters of different colors, such as multiple rows of red light emitters 542, multiple rows of green light emitters 544, and multiple rows of blue light emitters 546. For example, the red light emitters 542, the green light emitters 544, and the blue light emitters 546 may each include N rows, each row including, for example, 2,560 light emitters (pixels). The red light emitters 542 are organized into an array; the green light emitters 544 are organized into an array; and the blue light emitters 546 are organized into an array. In some embodiments, the light source 540 may include a single line of light emitters for each color. In some embodiments, the light source 540 may include multiple columns of light emitters for each of red, green, and blue colors, where each column may include, for example, 1,080 light emitters. In some embodiments, the dimensions and/or pitches of the light emitters in the light source 540 may be relatively large (e.g., about 3-5 µm) and thus the light source 540 may not include sufficient light emitters for simultaneously generating a full display image. For example, the number of light emitters for a single color may be fewer than the number of pixels (e.g., 2560×1080 pixels) in a display image. The light emitted by the light source 540 may be a set of collimated or diverging beams of light.

Before reaching the scanning mirror 570, the light emitted by the light source 540 may be conditioned by various optical devices, such as collimating lenses or a freeform optical element 560. The freeform optical element 560 may include, for example, a multi-facets prism or another light folding element that may direct the light emitted by the light source 540 towards the scanning mirror 570, such as changing the propagation direction of the light emitted by the light source 540 by, for example, about 90° or larger. In some embodiments, the freeform optical element 560 may be rotatable to scan the light. The scanning mirror 570 and/or the freeform optical element 560 may reflect and project the light emitted by the light source 540 to the waveguide display 580, which may include a coupler 582 for coupling the light emitted by the light source 540 into the waveguide display 580. The light coupled into the waveguide display 580 may propagate within the waveguide display 580 through, for example, total internal reflection as described above with respect to FIG. 4. The coupler 582 may also couple portions of the light propagating within the waveguide display 580 out of the waveguide display 580 and towards the user's eye 590.

The scanning mirror 570 may include a microelectromechanical system (MEMS) mirror or any other suitable mirrors. The scanning mirror 570 may rotate to scan in one or two dimensions. As the scanning mirror 570 rotates, the light emitted by the light source 540 may be directed to different areas of the waveguide display 580 such that a full display image may be projected onto the waveguide display 580 and directed to the user's eye 590 by the waveguide display 580 in each scanning cycle. For example, in embodiments where the light source 540 includes light emitters for all pixels in one or more rows or columns, the scanning mirror 570 may be rotated in the column or row direction (e.g., x or y direction) to scan an image. In embodiments where the light source 540 includes light emitters for some but not all pixels in one or more rows or columns, the scanning mirror 570 may be rotated in both the row and column directions (e.g., both x and y directions) to project a display image (e.g., using a raster-type scanning pattern).

The near-eye display device 550 may operate in predefined display periods. A display period (e.g., display cycle) may refer to a duration of time in which a full image is scanned or projected. For example, a display period may be a reciprocal of the desired frame rate. In the near-eye display device 550 that includes the scanning mirror 570, the display period may also be referred to as a scanning period or scanning cycle. The light generation by the light source 540 may be synchronized with the rotation of the scanning mirror 570. For example, each scanning cycle may include multiple scanning steps, where the light source 540 may generate a different light pattern in each respective scanning step.

In each scanning cycle, as the scanning mirror 570 rotates, a display image may be projected onto the waveguide display 580 and the user's eye 590. The actual color value and light intensity (e.g., brightness) of a given pixel location of the display image may be an average of the light beams of the three colors (e.g., red, green, and blue) illuminating the pixel location during the scanning period. After completing a scanning period, the scanning mirror 570 may revert back to the initial position to project light for the first few rows of the next display image or may rotate in a reverse direction or scan pattern to project light for the next display image, where a new set of driving signals may be fed to the light source 540. The same process may be repeated as the scanning mirror 570 rotates in each scanning cycle. As such, different images may be projected to the user's eye 590 in different scanning cycles.

Figure 6:
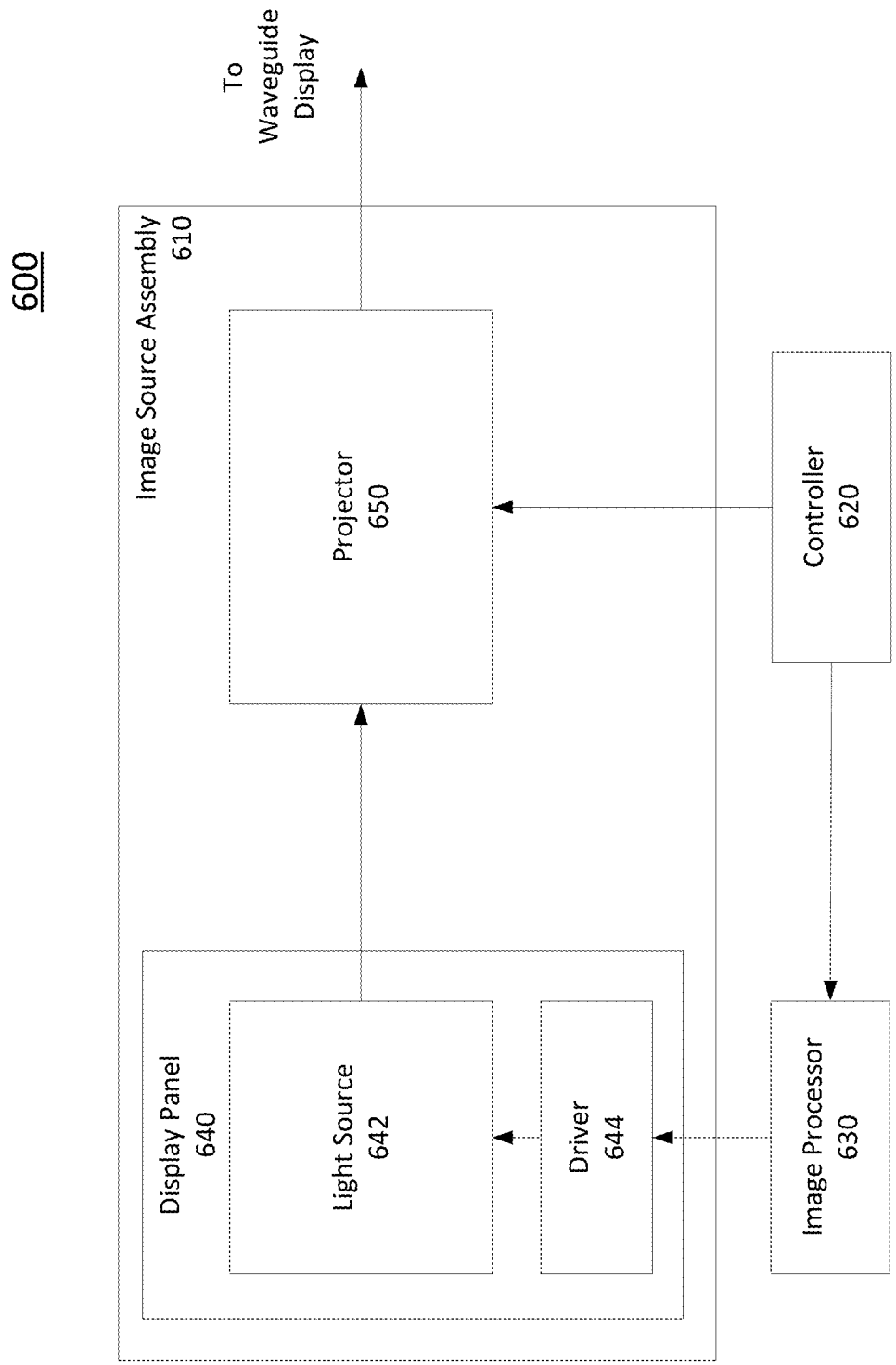
FIG. 6 illustrates an image source assembly in an augmented reality system, in accordance with one or more embodiments.

FIG. 6 illustrates an image source assembly 610 in a near-eye display system 600, in accordance with one or more embodiments. The image source assembly 610 may include, for example, a display panel 640 that may generate display images to be projected to the user's eyes, and a projector 650 that may project the display images generated by the display panel 640 to a waveguide display as described above with respect to FIGS. 4-5B. The display panel 640 may include a light source 642 and a driver circuit 644 for the light source 642. The light source 642 may include, for example, the light source 510 or 540. The projector 650 may include, for example, the freeform optical element 560, the scanning mirror 570, and/or the projection optics 520 described above in FIGS. 5A-5B. The near-eye display system 600 may also include a controller 620 that synchronously controls the light source 642 and the projector 650 (e.g., the scanning mirror 570). The image source assembly 610 may generate and output an image light to a waveguide display (not shown in FIG. 6), such as the waveguide display 530 or 580. As described above, the waveguide display may receive the image light at one or more input-coupling elements, and guide the received image light to one or more output-coupling elements. The input and output coupling elements may include, for example, a diffraction grating, a holographic grating, a prism, or any combination thereof. The input-coupling element may be chosen such that total internal reflection occurs with the waveguide display. The output-coupling element may couple portions of the total internally reflected image light out of the waveguide display.

As described above, the light source 642 may include a plurality of light emitters arranged in an array or a matrix. Each light emitter may emit monochromatic light, such as red light, blue light, green light, infra-red light, and the like. While RGB colors are often discussed in this disclosure, embodiments described herein are not limited to using red, green, and blue as primary colors. Other colors can also be used as the primary colors of the near-eye display system 600. In some embodiments, a display panel in accordance with an embodiment may use more than three primary colors. Each pixel in the light source 642 may include three subpixels that include a red micro-LED, a green micro-LED, and a blue micro-LED. A semiconductor LED generally includes an active light emitting layer within multiple layers of semiconductor materials. The multiple layers of semiconductor materials may include different compound materials or a same base material with different dopants and/or different doping densities. For example, the multiple layers of semiconductor materials may include an n-type material layer, an active region that may include hetero-structures (e.g., one or more quantum wells), and a p-type material layer. The multiple layers of semiconductor materials may be grown on a surface of a substrate having a certain orientation. In some embodiments, to increase light extraction efficiency, a mesa that includes at least some of the layers of semiconductor materials may be formed.

The controller 620 may control the image rendering operations of the image source assembly 610, such as the operations of the light source 642 and/or the projector 650. For example, the controller 620 may determine instructions for the image source assembly 610 to render one or more display images. The instructions may include display instructions and scanning instructions. In some embodiments, the display instructions may include an image file (e.g., a bitmap file). The display instructions may be received from, for example, a console, such as the console 110 described above with respect to FIG. 1. The scanning instructions may be used by the image source assembly 610 to generate image light. The scanning instructions may specify, for example, a type of a source of image light (e.g., monochromatic or polychromatic), a scanning rate, an orientation of a scanning apparatus, one or more illumination parameters, or any combination thereof. The controller 620 may include a combination of hardware, software, and/or firmware not shown here so as not to obscure other aspects of the present disclosure.

In some embodiments, the controller 620 may be a graphics processing unit (GPU) of a display device. In other embodiments, the controller 620 may be other kinds of processors. The operations performed by the controller 620 may include taking content for display and dividing the content into discrete sections. The controller 620 may provide to the light source 642 scanning instructions that include an address corresponding to an individual source element of the light source 642 and/or an electrical bias applied to the individual source element. The controller 620 may instruct the light source 642 to sequentially present the discrete sections using light emitters corresponding to one or more rows of pixels in an image ultimately displayed to the user. The controller 620 may also instruct the projector 650 to perform different adjustments of the light. For example, the controller 620 may control the projector 650 to scan the discrete sections to different areas of a coupling element of the waveguide display (e.g., the waveguide display 580) as described above with respect to FIG. 5B. As such, at the exit pupil of the waveguide display, each discrete portion is presented in a different respective location. While each discrete section is presented at a different respective time, the presentation and scanning of the discrete sections occur fast enough such that a user's eye may integrate the different sections into a single image or series of images.

An image processor 630 may be a general-purpose processor and/or one or more application-specific circuits that are dedicated to performing the features described herein. In one embodiment, a general-purpose processor may be coupled to a memory to execute software instructions that cause the processor to perform certain processes described herein. In another embodiment, the image processor 630 may be one or more circuits that are dedicated to performing certain features. While the image processor 630 in FIG. 6 is shown as a stand-alone unit that is separate from the controller 620 and the driver circuit 644, the image processor 630 may be a sub-unit of the controller 620 or the driver circuit 644 in other embodiments. In other words, in those embodiments, the controller 620 or the driver circuit 644 may perform various image processing functions of the image processor 630. The image processor 630 may also be referred to as an image processing circuit.

In the example shown in FIG. 6, the light source 642 may be driven by the driver circuit 644, based on data or instructions (e.g., display and scanning instructions) sent from the controller 620 or the image processor 630. In one embodiment, the driver circuit 644 may include a circuit panel that connects to and mechanically holds various light emitters of the light source 642. The light source 642 may emit light in accordance with one or more illumination parameters that are set by the controller 620 and potentially adjusted by the image processor 630 and the driver circuit 644. An illumination parameter may be used by the light source 642 to generate light. An illumination parameter may include, for example, source wavelength, pulse rate, pulse amplitude, beam type (continuous or pulsed), other parameter(s) that may affect the emitted light, or any combination thereof. In some embodiments, the source light generated by the light source 642 may include multiple beams of red light, green light, and blue light, or any combination thereof.

The projector 650 may perform a set of optical functions, such as focusing, combining, conditioning, or scanning the image light generated by the light source 642. In some embodiments, the projector 650 may include a combining assembly, a light conditioning assembly, or a scanning mirror assembly. The projector 650 may include one or more optical components that optically adjust and potentially re-direct the light from the light source 642. One example of the adjustment of light may include conditioning the light, such as expanding, collimating, correcting for one or more optical errors (e.g., field curvature, chromatic aberration, etc.), some other adjustments of the light, or any combination thereof. The optical components of the projector 650 may include, for example, lenses, mirrors, apertures, gratings, or any combination thereof.

The projector 650 may redirect image light via its one or more reflective and/or refractive portions so that the image light is projected at certain orientations toward the waveguide display. The location where the image light is redirected toward may depend on specific orientations of the one or more reflective and/or refractive portions. In some embodiments, the projector 650 includes a single scanning mirror that scans in at least two dimensions. In other embodiments, the projector 650 may include a plurality of scanning mirrors that each scan in directions orthogonal to each other. The projector 650 may perform a raster scan (horizontally or vertically), a bi-resonant scan, or any combination thereof. In some embodiments, the projector 650 may perform a controlled vibration along the horizontal and/or vertical directions with a specific frequency of oscillation to scan along two dimensions and generate a 2D projected image of the media presented to user's eyes. In other embodiments, the projector 650 may include a lens or prism that may serve similar or the same function as one or more scanning mirrors. In some embodiments, the image source assembly 610 may not include a projector, where the light emitted by the light source 642 may be directly incident on the waveguide display.

Figure 7A:
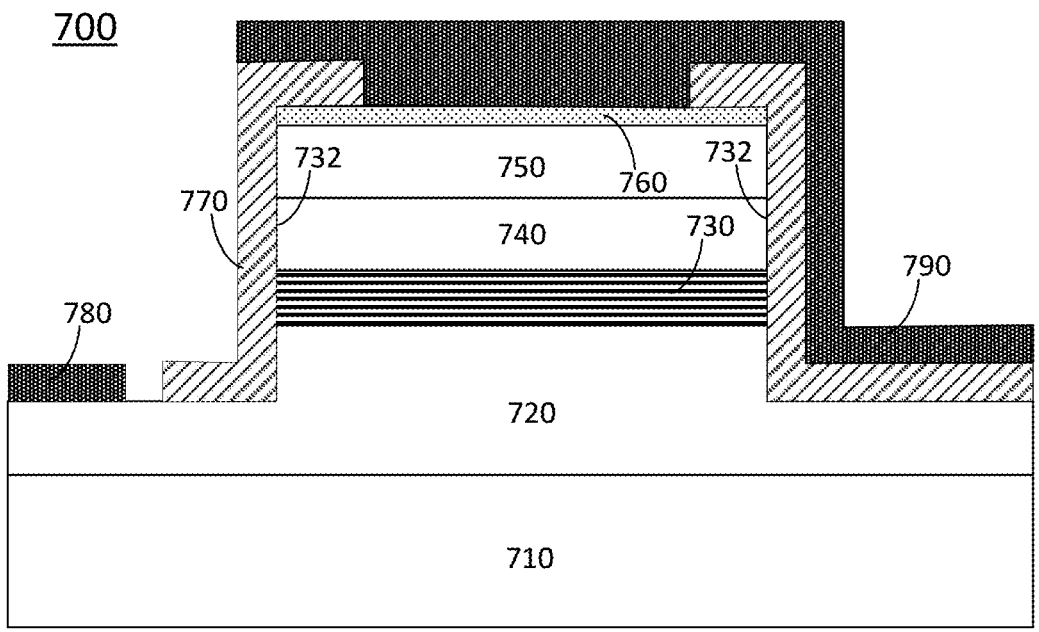
FIG. 7A illustrates a light emitting diode (LED) having a vertical mesa structure, in accordance with one or more embodiments.

FIG. 7A illustrates a light emitting diode (LED) 700 having a vertical mesa structure, in accordance with one or more embodiments. The LED 700 may be a light emitter in the light source 510, 540, or 642. The LED 700 may be a micro-LED made of inorganic materials, such as multiple layers of semiconductor materials. The layered semiconductor light emitting device may include multiple layers of III-V semiconductor materials. A III-V semiconductor material may include one or more Group III elements, such as aluminum (Al), gallium (Ga), or indium (In), in combination with a Group V element, such as nitrogen (N), phosphorus (P), arsenic (As), or antimony (Sb). When the Group V element of the III-V semiconductor material includes nitrogen, the III-V semiconductor material is referred to as a III-nitride material. The layered semiconductor light emitting device may be manufactured by growing multiple epitaxial layers on a substrate using techniques such as vapor-phase epitaxy (VPE), liquid-phase epitaxy (LPE), molecular beam epitaxy (MBE), or metalorganic chemical vapor deposition (MOCVD). For example, the layers of the semiconductor materials may be grown layer-by-layer on a substrate with a certain crystal lattice orientation (e.g., polar, nonpolar, or semi-polar orientation), such as a GaN, GaAs, or GaP substrate, or a substrate including, but not limited to, sapphire, silicon carbide, silicon, zinc oxide, boron nitride, lithium aluminate, lithium niobate, germanium, aluminum nitride, lithium gallate, partially substituted spinels, or quaternary tetragonal oxides sharing the beta-$LiAlO_2$ structure, where the substrate may be cut in a specific direction to expose a specific plane as the growth surface.

In the example shown in FIG. 7A, the LED 700 may include a substrate 710, which may include, for example, a sapphire substrate or a GaN substrate. A semiconductor layer 720 may be grown on the substrate 710. The semiconductor layer 720 may include a III-V material, such as GaN, and may be p-doped (e.g., with Mg, Ca, Zn, or Be) or n-doped (e.g., with Si or Ge). One or more active layers 730 may be grown on the semiconductor layer 720 to form an active region. The active layer 730 may include III-V materials, such as one or more InGaN layers, one or more AlInGaP layers, and/or one or more GaN layers, which may form one or more heterostructures, such as one or more quantum wells or MQWs. A semiconductor layer 740 may be grown on the active layer 730. The semiconductor layer 740 may include a III-V material, such as GaN, and may be p-doped (e.g., with Mg, Ca, Zn, or Be) or n-doped (e.g., with Si or Ge). One of semiconductor layer 720 and semiconductor layer 740 may be a p-type layer and the other one may be an n-type layer. The semiconductor layer 720 and the semiconductor layer 740 sandwich the active layer 730 to form the light emitting region. For example, the LED 700 may include a layer of InGaN situated between a layer of p-type GaN doped with magnesium and a layer of n-type GaN doped with silicon or oxygen. In some embodiments, the LED 700 may include a layer of AlInGaP situated between a layer of p-type AlInGaP doped with zinc or magnesium and a layer of n-type AlInGaP doped with selenium, silicon, or tellurium.

In some embodiments, an electron-blocking layer (EBL) (not shown in FIG. 7A) may be grown to form a layer between the active layer 730 and at least one of the semiconductor layer 720 or the semiconductor layer 740. The EBL may reduce the electron leakage current and improve the efficiency of the LED. In some embodiments, a heavily-doped semiconductor layer 750, such as a P+ or P++ semiconductor layer, may be formed on the semiconductor layer 740 and act as a contact layer for forming an ohmic contact and reducing the contact impedance of the device. In some embodiments, a conductive layer 760 may be formed on the heavily-doped semiconductor layer 750. The conductive layer 760 may include, for example, an indium tin oxide (ITO) or Al/Ni/Au film. In one example, the conductive layer 760 may include a transparent ITO layer.

To make contact with the semiconductor layer 720 (e.g., an n-GaN layer) and to more efficiently extract light emitted by the active layer 730 from the LED 700, the semiconductor material layers (including the heavily-doped semiconductor layer 750, the semiconductor layer 740, the active layer 730, and the semiconductor layer 720) may be etched to expose the semiconductor layer 720 and to form a mesa structure that includes the layers 720-760. The mesa structure may confine the carriers within the device. Etching the mesa structure may lead to the formation of mesa sidewalls 732 that may be orthogonal to the growth planes. A passivation layer 770 may be formed on the sidewalls 732 of the mesa structure. The passivation layer 770 may include an oxide layer, such as a $SiO_2$ layer, and may act as a reflector to reflect emitted light out of the LED 700. A contact layer 780, which may include a metal layer, such as Al, Au, Ni, Ti, or any combination thereof, may be formed on the semiconductor layer 720 and may act as an electrode of the LED 700. In addition, another contact layer 790, such as an Al/Ni/Au metal layer, may be formed on the conductive layer 760 and may act as another electrode of the LED 700.

When a voltage signal is applied to the contact layers 780 and 790, electrons and holes may recombine in the active layer 730, where the recombination of electrons and holes may cause photon emission. The wavelength and energy of the emitted photons may depend on the energy bandgap between the valence band and the conduction band in the active layer 730. For example, InGaN active layers may emit green or blue light, AlGaN active layers may emit blue to ultraviolet light, while AlInGaP active layers may emit red, orange, yellow, or green light. The emitted photons may be reflected by the passivation layer 770 and may exit the LED 700 from the top (e.g., the conductive layer 760 and the contact layer 790) or bottom (e.g., the substrate 710).

In some embodiments, the LED 700 may include one or more other components, such as a lens, on the light emission surface, such as the substrate 710, to focus or collimate the emitted light or couple the emitted light into a waveguide. In some embodiments, an LED may include a mesa of another shape, such as planar, conical, semi-parabolic, or parabolic, and a base area of the mesa may be circular, rectangular, hexagonal, or triangular. For example, the LED may include a mesa of a curved shape (e.g., paraboloid shape) and/or a non-curved shape (e.g., conic shape). The mesa may be truncated or non-truncated.

Figure 7B:
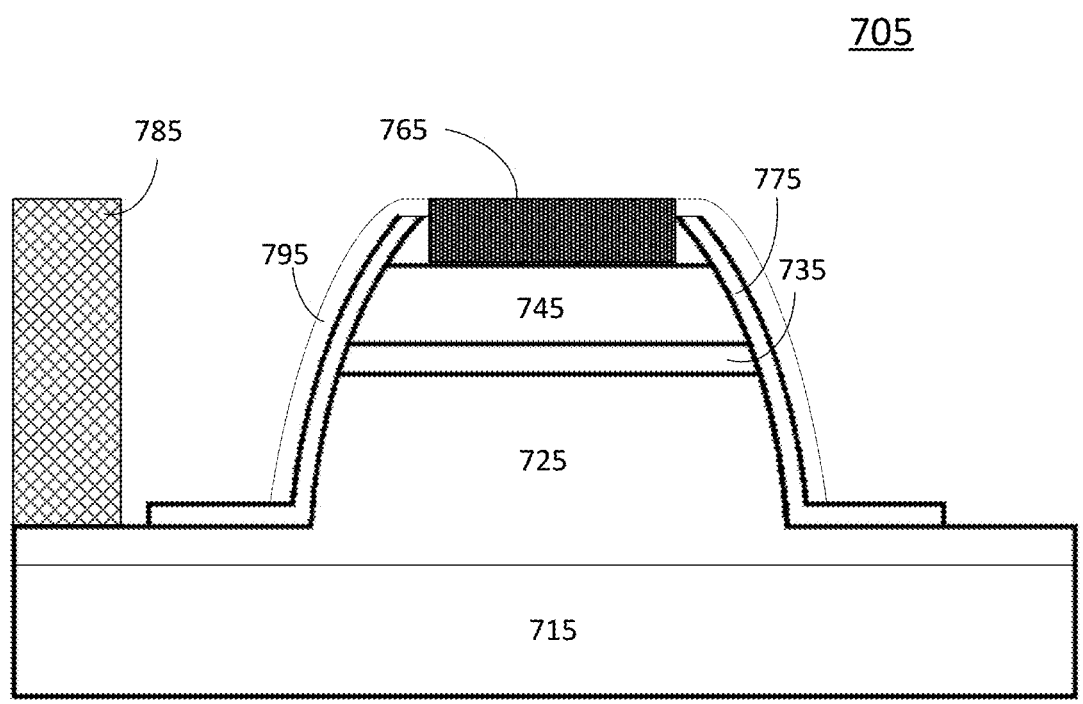
FIG. 7B is a cross-sectional view of a LED having a parabolic mesa structure, in accordance with one or more embodiments.

FIG. 7B is a cross-sectional view of a LED 705 having a parabolic mesa structure, in accordance with one or more embodiments. Similar to the LED 700, LED 705 may include multiple layers of semiconductor materials, such as multiple layers of III-V semiconductor materials. The semiconductor material layers may be epitaxially grown on a substrate 715, such as a GaN substrate or a sapphire substrate. For example, a semiconductor layer 725 may be grown on the substrate 715. The semiconductor layer 725 may include a III-V material, such as GaN, and may be p-doped (e.g., with Mg, Ca, Zn, or Be) or n-doped (e.g., with Si or Ge). One or more active layers 735 may be grown on the semiconductor layer 725. The active layer 735 may include III-V materials, such as one or more InGaN layers, one or more AlInGaP layers, and/or one or more GaN layers, which may form one or more heterostructures, such as one or more quantum wells. A semiconductor layer 745 may be grown on the active layer 735. The semiconductor layer 745 may include a III-V material, such as GaN, and may be p-doped (e.g., with Mg, Ca, Zn, or Be) or n-doped (e.g., with Si or Ge). One of the semiconductor layer 725 and the semiconductor layer 745 may be a p-type layer and the other one may be an n-type layer.

To make contact with the semiconductor layer 725 (e.g., an n-type GaN layer) and to more efficiently extract light emitted by the active layer 735 from the LED 705, the semiconductor layers may be etched to expose the semiconductor layer 725 and to form a mesa structure that includes the layers 725-745. The mesa structure may confine carriers within the injection area of the device. Etching the mesa structure may lead to the formation of mesa side walls (also referred to herein as facets) that may be non-parallel with, or in some cases, orthogonal, to the growth planes associated with crystalline growth of the layers 725-745.

As shown in FIG. 7B, the LED 705 may have a mesa structure that includes a flat top. A dielectric layer 775 (e.g., $SiO_2$ or $SiN_x$) may be formed on the facets of the mesa structure. In some embodiments, the dielectric layer 775 may include multiple layers of dielectric materials. In some embodiments, a metal layer 795 may be formed on the dielectric layer 775. The metal layer 795 may include one or more metal or metal alloy materials, such as aluminum (Al), silver (Ag), gold (Au), platinum (Pt), titanium (Ti), copper (Cu), or any combination thereof. The dielectric layer 775 and the metal layer 795 may form a mesa reflector that can reflect light emitted by the active layer 735 toward the substrate 715. In some embodiments, the mesa reflector may be parabolic-shaped to act as a parabolic reflector that may at least partially collimate the emitted light.

An electrical contact 765 and an electrical contact 785 may be formed on the semiconductor layer 745 and the semiconductor layer 725, respectively, to act as electrodes. The electrical contact 765 and the electrical contact 785 may each include a conductive material, such as Al, Au, Pt, Ag, Ni, Ti, Cu, or any combination thereof (e.g., Ag/Pt/Au or Al/Ni/Au), and may act as the electrodes of the LED 705. In the example shown in FIG. 7B, the electrical contact 785 may be an n-contact, and the electrical contact 765 may be a p-contact. The electrical contact 765 and the semiconductor layer 745 (e.g., a p-type semiconductor layer) may form a back reflector for reflecting light emitted by the active layer 735 back toward the substrate 715. In some embodiments, the electrical contact 765 and the metal layer 795 include same material(s) and can be formed using the same processes. In some embodiments, an additional conductive layer (not shown) may be included as an intermediate conductive layer between the electrical contacts 765 and 785 and the semiconductor layers.

When a voltage signal is applied across the electrical contacts 765 and 785, electrons and holes may recombine in the active layer 735. The recombination of electrons and holes may cause photon emission, thus producing light. The wavelength and energy of the emitted photons may depend on the energy bandgap between the valence band and the conduction band in the active layer 735. For example, InGaN active layers may emit green or blue light, while AlInGaP active layers may emit red, orange, yellow, or green light. The emitted photons may propagate in many different directions, and may be reflected by the mesa reflector and/or the back reflector and may exit the LED 705, for example, from the bottom side (e.g., the substrate 715) shown in FIG. 7B. One or more other secondary optical components, such as a lens or a grating, may be formed on the light emission surface, such as the substrate 715, to focus or collimate the emitted light and/or couple the emitted light into a waveguide.

One or 2D arrays of the LEDs described above may be manufactured on a wafer to form light sources (e.g., the light source 642). Driver circuits (e.g., the driver circuit 644) may be fabricated, for example, on a silicon wafer using CMOS processes. The LEDs and the driver circuits on wafers may be diced and then bonded together, or may be bonded on the wafer level and then diced. Various bonding techniques can be used for bonding the LEDs and the driver circuits, such as adhesive bonding, metal-to-metal bonding, metal oxide bonding, wafer-to-wafer bonding, die-to-wafer bonding, hybrid bonding, and the like.

FIG. 8A illustrates a method of die-to-wafer bonding for arrays of LEDs, in accordance with one or more embodiments. In the example shown in FIG. 8A, an LED array 801 may include a plurality of LEDs 807 on a carrier substrate 805. The carrier substrate 805 may include various materials, such as GaAs, InP, GaN, AlN, sapphire, SiC, Si, or the like. The LEDs 807 may be fabricated by, for example, growing various epitaxial layers, forming mesa structures, and forming electrical contacts or electrodes, before performing the bonding. The epitaxial layers may include various materials, such as GaN, InGaN, (AlGaIn)P, (AlGaIn)AsP, (AlGaIn)AsN, (AlGaIn)Pas, (Eu:InGa)N, (AlGaIn)N, or the like, and may include an n-type layer, a p-type layer, and an active layer that includes one or more heterostructures, such as one or more quantum wells or MQWs. The electrical contacts may include various conductive materials, such as a metal or a metal alloy.

A wafer 803 may include a base layer 809 having passive or active integrated circuits (e.g., driver circuits 811) fabricated thereon. The base layer 809 may include, for example, a silicon wafer. The driver circuits 811 may be used to control the operations of the LEDs 807. For example, the driver circuit for each of the LEDs 807 may include a 2T1C pixel structure that has two transistors and one capacitor. The wafer 803 may also include a bonding layer 813. The bonding layer 813 may include various materials, such as a metal, an oxide, a dielectric, CuSn, AuTi, and the like. In some embodiments, a patterned layer 815 may be formed on a surface of the bonding layer 813, where the patterned layer 815 may include a metallic grid made of a conductive material, such as Cu, Ag, Au, Al, or the like.

An LED array 801 may be bonded to the wafer 803 via the bonding layer 813 or the patterned layer 815. For example, the patterned layer 815 may include metal pads, bumps, and/or interconnects made of various materials, such as CuSn, AuSn, or nanoporous metal, that may be used to align the LEDs 807 of the LED array 801 with corresponding driver circuits 811 on the wafer 803. In one example, the LED array 801 may be brought toward the wafer 803 until the LEDs 807 come into contact with respective metal pads, bumps, and/or interconnects corresponding to the driver circuits 811. Some or all of the LEDs 807 may be aligned with the driver circuits 811, and may then be bonded to the wafer 803 via the patterned layer 815 by various bonding techniques, such as metal-to-metal bonding. After the LEDs 807 have been bonded to the wafer 803, the carrier substrate 805 may be removed from the LEDs 807.

FIG. 8B illustrates a method of wafer-to-wafer bonding for arrays of LEDs, in accordance with one or more embodiments. As shown in FIG. 8B, a first wafer 802 may include a substrate 804, a first semiconductor layer 806, one or more active layers 808, and a second semiconductor layer 810. The substrate 804 may include various materials, such as GaAs, InP, GaN, AlN, sapphire, SiC, Si, or the like. The first semiconductor layer 806, the active layers 808, and the second semiconductor layer 810 may include various semiconductor materials, such as GaN, InGaN, (AlGaIn)P, (AlGaIn)AsP, (AlGaIn)AsN, (AlGaIn)Pas, (EuInGa)N, (AlGaIn)N, or the like. In some embodiments, the first semiconductor layer 806 may be an n-type layer, and the second semiconductor layer 810 may be a p-type layer. For example, the first semiconductor layer 806 may be an n-doped GaN layer (e.g., doped with Si or Ge), and the second semiconductor layer 810 may be a p-doped GaN layer (e.g., doped with Mg, Ca, Zn, or Be). The active layers 808 may include, for example, one or more GaN layers, one or more InGaN layers, one or more AlInGaP layers, and the like, which may form one or more heterostructures, such as one or more quantum wells or MQWs.

In some embodiments, the first wafer 802 may also include a bonding layer 812. The bonding layer 812 may include various materials, such as a metal, an oxide, a dielectric, CuSn, AuTi, nanoporous metal, or the like. In one example, the bonding layer 812 may include p-contacts and/or n-contacts (not shown). In some embodiments, other layers may also be included on the first wafer 802, such as a buffer layer between the substrate 804 and the first semiconductor layer 806. The buffer layer may include various materials, such as polycrystalline GaN or AlN. In some embodiments, a contact layer may be between the second semiconductor layer 810 and the bonding layer 812. The contact layer may include any suitable material for providing an electrical contact to the second semiconductor layer 810 and/or the first semiconductor layer 806.

The first wafer 802 may be bonded to a wafer 803 that includes driver circuits 811 and a bonding layer 813 as described above, via the bonding layer 813 and/or the bonding layer 812. The bonding layer 812 and the bonding layer 813 may be made of the same material or different materials. The bonding layer 812 and the bonding layer 813 may be substantially flat. The first wafer 802 may be bonded to the wafer 803 by various methods, such as metal-to-metal bonding, eutectic bonding, metal oxide bonding, anodic bonding, thermo-compression bonding, ultraviolet (UV) bonding, and/or fusion bonding.

As shown in FIG. 8B, the first wafer 802 may be bonded to the wafer 803 with the p-side (e.g., the second semiconductor layer 810) of the first wafer 802 facing down (i.e., toward the wafer 803). After bonding, the substrate 804 may be removed from the first wafer 802, and the first wafer 802 may then be processed from the n-side. The processing may include, for example, the formation of certain mesa shapes for individual LEDs, as well as the formation of optical components corresponding to the individual LEDs.

FIGS. 9A-9D illustrates a method of hybrid bonding for arrays of LEDs, in accordance with one or more embodiments. The hybrid bonding may generally include wafer cleaning and activation, high-precision alignment of contacts of one wafer with contacts of another wafer, dielectric bonding of dielectric materials at the surfaces of the wafers at room temperature, and metal bonding of the contacts by annealing at elevated temperatures. FIG. 9A shows a substrate 910 with passive or active circuits 920 manufactured thereon. As described above with respect to FIGS. 8A-8B, the substrate 910 may include, for example, a silicon wafer. The circuits 920 may include driver circuits for the arrays of LEDs and various electrical interconnects. A bonding layer may include dielectric regions 940 and contact pads 930 connected to the circuits 920 through electrical interconnects. The contact pads 930 may include solid metal and/or nanoporous metal, for example, the metals may include Cu, Ag, Au, Al, W, Mo, Ni, Ti, Pt, Pd, or the like. Dielectric materials in the dielectric regions 940 may include SiCN, $SiO_2$, SiN, $Al_2O_3$, $HfO_2$, $ZrO_2$, $Ta_2O_5$, or the like. The bonding layer may be planarized and polished using, for example, chemical mechanical polishing, where the planarization or polishing may cause dishing (a bowl like profile) in the contact pads. The surfaces of the bonding layers may be cleaned and activated by, for example, an ion (e.g., plasma) or a fast atom (e.g., Ar) beam 905. The activated surface may be atomically clean and may be reactive for formation of direct bonds between wafers when they are brought into contact, for example, at room temperature.

FIG. 9B illustrates a wafer 950 including an array of micro-LEDs 970 fabricated thereon as described above with respect to, for example, FIGS. 7A-8B. The wafer 950 may be a carrier wafer and may include, for example, GaAs, InP, GaN, AlN, sapphire, SiC, Si, or the like. The micro-LEDs 970 may include an n-type layer, an active region, and a p-type layer epitaxially grown on the wafer 950. The epitaxial layers may include various III-V semiconductor materials described above, and may be processed from the p-type layer side to etch mesa structures in the epitaxial layers, such as substantially vertical structures, parabolic structures, conic structures, or the like. Passivation layers and/or reflection layers may be formed on the sidewalls of the mesa structures. P-contacts 980 and n-contacts 982 may be formed in a dielectric material layer 960 deposited on the mesa structures and may make electrical contacts with the p-type layer and the n-type layers, respectively. Dielectric materials in the dielectric material layer 960 may include, for example, SiCN, $SiO_2$, SiN, $Al_2O_3$, $HfO_2$, $ZrO_2$, $Ta_2O_5$, or the like. The p-contacts 980 and the n-contacts 982 may include solid metal and/or nanoporous metal, for example, the metals may include Cu, Ag, Au, Al, W, Mo, Ni, Ti, Pt, Pd, or the like. The top surfaces of the p-contacts 980, the n-contacts 982, and the dielectric material layer 960 may form a bonding layer. The bonding layer may be planarized and polished using, for example, chemical mechanical polishing, where the polishing may cause dishing in the p-contacts 980 and the n-contacts 982. The bonding layer may then be cleaned and activated by, for example, an ion (e.g., plasma) or the fast atom (e.g., Ar) beam 915. The activated surface may be atomically clean and reactive for formation of direct bonds between wafers when they are brought into contact, for example, at room temperature.

FIG. 9C illustrates a room temperature bonding process for bonding the dielectric materials in the bonding layers. For example, after the bonding layer that includes the dielectric regions 940 and the contact pads 930 and the bonding layer that includes the p-contacts 980, the n-contacts 982, and the dielectric material layer 960 are surface activated, the wafer 950 and the micro-LEDs 970 may be turned upside down and brought into contact with the substrate 910 and the circuits formed thereon. In some embodiments, compression pressure 925 may be applied to the substrate 910 and the wafer 950 such that the bonding layers are pressed against each other. Due to the surface activation and the dishing in the contacts, the dielectric regions 940 and the dielectric material layer 960 may be in direct contact because of the surface attractive force, and may react and form chemical bonds between them because the surface atoms may have dangling bonds and may be in unstable energy states after the activation. Thus, the dielectric materials in the dielectric regions 940 and the dielectric material layer 960 may be bonded together with or without heat treatment or pressure.

FIG. 9D illustrates an annealing process for bonding the contacts in the bonding layers after bonding the dielectric materials in the bonding layers. For example, the contact pads 930 and the p-contacts 980 or the n-contacts 982 may be bonded together by annealing at, for example, about 200-400° C. or higher. During the annealing process, heat 935 (e.g., emitted by a laser) may cause the contacts to expand more than the dielectric materials (due to different coefficients of thermal expansion), and thus may close the dishing gaps between the contacts such that the contact pads 930 and the p-contacts 980 or the n-contacts 982 may be in contact and may form direct metallic bonds at the activated surfaces.

In some embodiments where the two bonded wafers include materials having different coefficients of thermal expansion (CTEs), the dielectric materials bonded at room temperature may help to reduce or prevent misalignment of the contact pads caused by the different thermal expansions. In some embodiments, to further reduce or avoid the misalignment of the contact pads at a high temperature during annealing, trenches may be formed between micro-LEDs, between groups of micro-LEDs, through part or all of the substrate, or the like, before bonding.

After the micro-LEDs are bonded to the driver circuits, the substrate on which the micro-LEDs are fabricated may be thinned or removed, and various secondary optical components may be fabricated on the light emitting surfaces of the micro-LEDs to, for example, extract, collimate, and redirect the light emitted from the active regions of the micro-LEDs. In one example, micro-lenses may be formed on the micro-LEDs, where each micro-lens may correspond to a respective micro-LED and may help to improve the light extraction efficiency and collimate the light emitted by the micro-LED. In some embodiments, the secondary optical components may be fabricated in the substrate or the n-type layer of the micro-LEDs. In some embodiments, the secondary optical components may be fabricated in a dielectric layer deposited on the n-type side of the micro-LEDs. Examples of the secondary optical components may include a lens, a grating, an antireflection (AR) coating, a prism, a photonic crystal, or the like.

Figure 10:
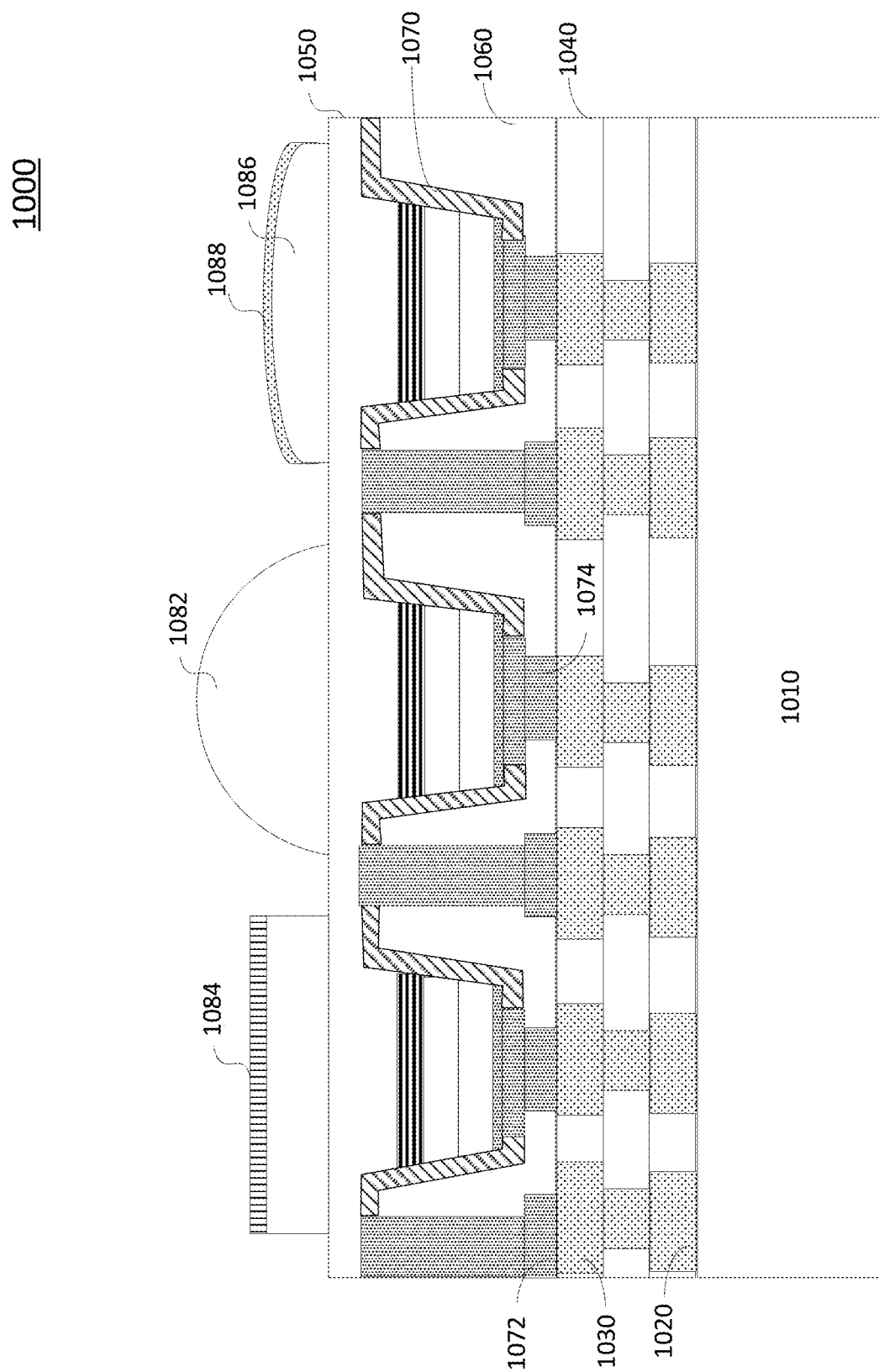
FIG. 10 illustrates a LED array with secondary optical components fabricated thereon, in accordance with one or more embodiments.

FIG. 10 illustrates a LED array 1000 with secondary optical components fabricated thereon, in accordance with one or more embodiments. The LED array 1000 may be made by bonding an LED chip or wafer with a silicon wafer including electrical circuits fabricated thereon, using any suitable bonding techniques described above with respect to, for example, FIGS. 8A-9D. In the example shown in FIG. 10, the LED array 1000 may be bonded using a wafer-to-wafer hybrid bonding technique as described above with respect to FIG. 9A-9D. The LED array 1000 may include a substrate 1010, which may be, for example, a silicon wafer. Integrated circuits 1020, such as LED driver circuits, may be fabricated on the substrate 1010. The integrated circuits 1020 may be connected to p-contacts 1074 and n-contacts 1072 of micro-LEDs 1070 through contact pads 1030, where the contact pads 1030 may form metallic bonds with the p-contacts 1074 and the n-contacts 1072. A dielectric layer 1040 on the substrate 1010 may be bonded to a dielectric layer 1060 through fusion bonding.

The substrate (not shown) of the LED chip or wafer may be thinned or may be removed to expose the n-type layer 1050 of the micro-LEDs 1070. Various secondary optical components, such as a spherical micro-lens 1082, a grating 1084, a micro-lens 1086, an antireflection layer 1088, and the like, may be formed in or on top of the n-type layer 1050. For example, spherical micro-lens arrays may be etched in the semiconductor materials of the micro-LEDs 1070 using a gray-scale mask and a photoresist with a linear response to exposure light, or using an etch mask formed by thermal reflowing of a patterned photoresist layer. The secondary optical components may also be etched in a dielectric layer deposited on the n-type layer 1050 using similar photolithographic techniques or other techniques. For example, micro-lens arrays may be formed in a polymer layer through thermal reflowing of the polymer layer that is patterned using a binary mask. The micro-lens arrays in the polymer layer may be used as the secondary optical components or may be used as the etch mask for transferring the profiles of the micro-lens arrays into a dielectric layer or a semiconductor layer. The dielectric layer may include, for example, SiCN, $SiO_2$, SiN, $Al_2O_3$, $HfO_2$, $ZrO_2$, $Ta_2O_5$, or the like. In some embodiments, the micro-LED 1070 may have multiple corresponding secondary optical components, such as a micro-lens and an anti-reflection coating, a micro-lens etched in the semiconductor material and a micro-lens etched in a dielectric material layer, a micro-lens and a grating, a spherical lens and an aspherical lens, and the like. Three different secondary optical components are illustrated in FIG. 10 to show some examples of secondary optical components that can be formed on the micro-LEDs 1070, which does not necessary imply that different secondary optical components are used simultaneously for every LED array.

Figure 11A:
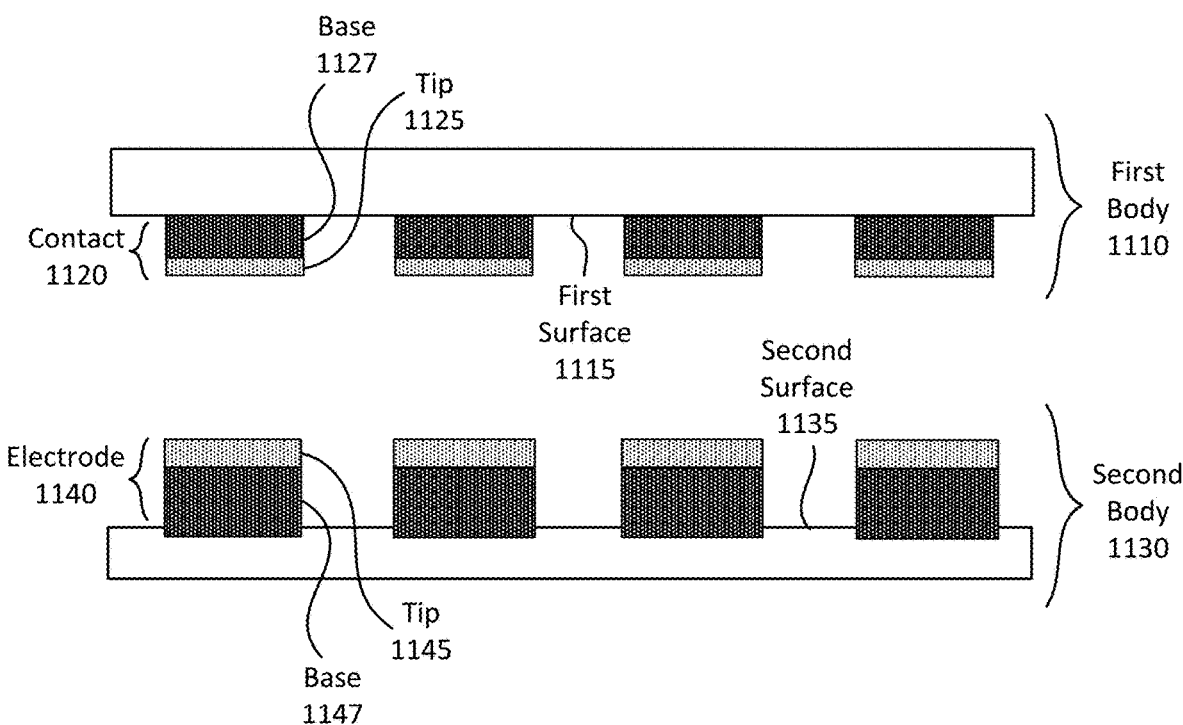
FIGS. 11A and 11B are cross-sectional views of bonding contacts and electrodes using nanoporous metal tips as a hybrid interconnect, in accordance with one or more embodiments.
Figure 11B:
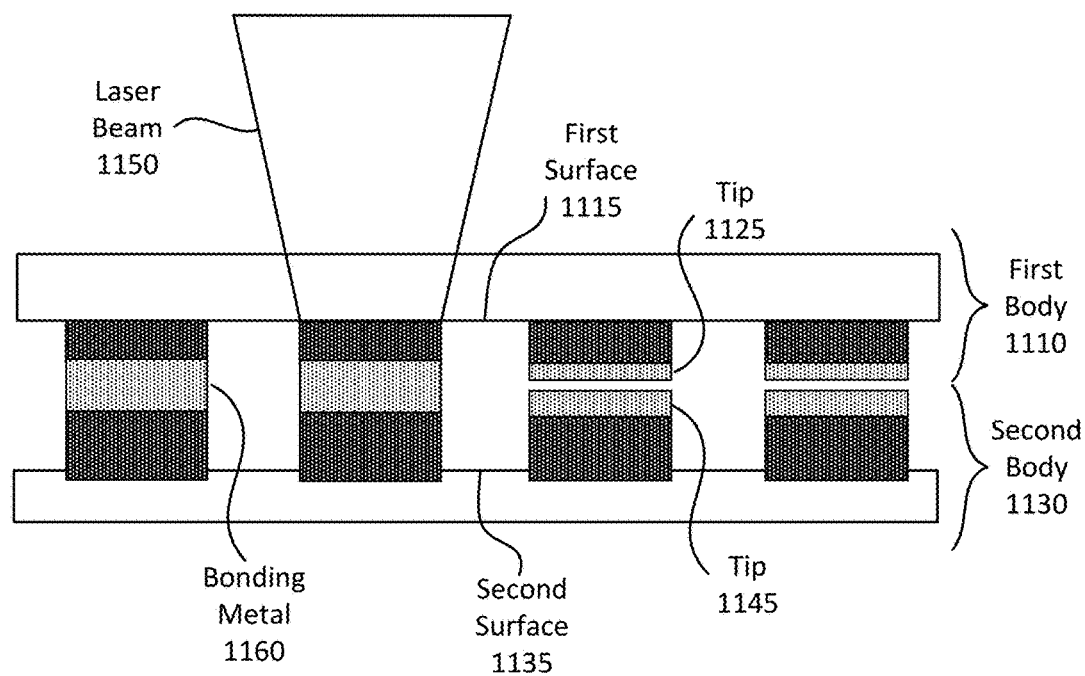

FIGS. 11A and 11B are cross-sectional views of bonding contacts 1120 and electrodes 1140 using nanoporous metal tips (i.e., tips 1125 and tips 1145) as a hybrid interconnect, in accordance with one or more embodiments. FIG. 11A shows a first body 1110 and a second body 1130 prior to being adjoined, according to an embodiment. The first body 1110 has a first surface 1115 with a plurality of contacts 1120 protruding from the first surface 1115. In this embodiment, illustrated in FIG. 11A, the contacts 1120 include nanoporous metal tips 1125 formed on top of a base layer 1127. The base layer 1127 may be made of a solid metal (e.g., Ti, Au, or other alloy). In some embodiments (not shown), the contacts 1120 do not include nanoporous metal tips 1125. The nanoporous metal tips 1125 may by formed on the contacts 1120 using fabrication methods well known in the art. An example nanoporous metal tip fabrication method known to one skilled in the art is further described in "Nanoporous interconnects" by Herman Oppermann, Lothar Dietrich, Matthias Klein, and Bernhard Wunderle and published by 3*rd Electronics System Integration Technology Conference ESTC* in September 2010, which is hereby incorporated by reference in its entirety for all purposes. The first body 1110 may also include a backplane substrate with CMOS periphery circuits. The first body 1110 may be a die or a wafer, as described above with reference to FIGS. 8A-9D.

The second body 1130 may comprise a substrate on which an array of light sources (e.g., an array of LEDs, such as an array of μLEDs) is formed. The array of light sources has a light-emission side and a side opposite the light-emission side. The second body 1130 has a second surface 1135 that faces the first surface 1115 of the first body 1110. In one example, the second surface 1135 is the side opposite the light-emission side. The second surface 1135 has a plurality of electrodes 1140 protruding from the second surface 1135 that are connected to electrical components or conductive traces in the second body 1130. In this embodiment, illustrated in FIG. 11A, the electrodes 1140 include nanoporous metal tips 1145 formed on top of a base layer 1147. The base layer 1147 may be made of a solid metal (e.g., Au). In some embodiments (not shown), the electrodes 1140 do not include nanoporous metal tips 1145. In one example, the first surface 1115 and/or the second surface 1135 may include a top insulation layer or a top passivation layer. The second body 1130 may be a die or a wafer separate from the first body 1110, as described above with reference to FIGS. 8A-9D.

As shown in FIG. 11A, the contacts 1120 and the corresponding electrodes 1140 are not in contact or adjoined, but are aligned such that if either the first surface 1115 or the second surface 1135 were moved towards the other along a linear path, each contact 1120 would engage with a corresponding electrode 1140. In another embodiment, the first body 1110 comprises one or more LEDs and the second body 1130 comprises a circuit to operate the one or more LEDs. The LEDs may have a size of less than 100 μm (i.e., the LEDs may be micro-LEDs).

FIG. 11B illustrates the first body 1110 and the second body 1130 bonded using a laser beam 1150, according to one embodiment. In one embodiment, the laser beam 1150 may be applied to at least one of the contacts 1120 and the electrodes 1140 at a time. In some embodiments, the laser beam 1150 may be projected onto a subset of the contacts 1120 and the electrodes 1140 at a time. In one embodiment, the laser beam 1150 may be applied to the first body 1110. In some embodiments, the laser beam 1150 may be applied to the second body 1130. The laser beam 1150 may be scanned across either the first body 1110 or the second body 1130. As the contacts and the electrodes are exposed to the laser beam 1150, the nanoporous metal tips (i.e., the tips 1125 and the tips 1145, respectively) melt and form bonding metal 1160. The bonding metal 1160 is the melted and solidified nanoporous metal tips 1125, 1145. The bonding metal 1160 establishes an interconnection between the contacts and the electrodes and bonds the first body 1110 to the second body 1130. In one example, the laser beam 1150 emits light with a wavelength of 360 nm (i.e., an ultraviolet ray) and forms a spot of 1.5-2 mm on the first body 1110. In this example, a whole 3×4 mm chip may be bonded in a few seconds. In another example, the laser beam 1150 emits light with a wavelength of below 360 nm and forms a spot of 1 mm.

In one embodiment, the interconnection formed between the contacts 1120 and the electrodes 1140 (i.e., where bonding metal 1160 is formed) may connect the electrodes of the light sources of the second body 1130 with the CMOS periphery circuits in the backplane substrate of the first body 1110. The CMOS periphery circuits may supply electrical current to the light sources through the interconnection. The number of the interconnections established may be less than the number of light sources in the array of light sources as one interconnection may be used to enable sending data to operate multiple light sources.

FIG. 12 is a flowchart illustrating a process for interconnecting a first body to a second body via contact and electrodes using nanoporous metal tips, in accordance with one or more embodiments. The process may include different or additional steps than those described in conjunction with FIG. 12 in some embodiments or perform steps in difference orders than the order described in conjunction with FIG. 12.

As illustrated in FIGS. 11A and 11B, the first body of the interconnect (i.e., the first body 1110) on which contacts protrude from a first surface is positioned 1210 relative to the second body (i.e., the second body 1130) to align the contacts with corresponding electrodes on the second body. The electrodes protrude from a second surface on the second body. The second surface faces the first surface. The contacts, the electrodes, or both comprise nanoporous metal tips. After the first body and the second body are positioned, the first body approaches 1220 the second body such that the position of the first body is moved towards the second body until the contacts and the electrodes are separated by less than a predetermined distance. The contacts and the electrodes bond 1230 establishing an interconnect between the first body and the second body. The bond takes place by melting and solidifying the nanoporous metal tips.

In some embodiments, the contacts and the electrodes are mounted to the opposite bodies of the interconnect compared to the above description. For example, the contacts are formed on the second body (specifically, on the second surface of the second body) and the electrodes are formed on the first body (specifically, on the first surface of the first body).

The methods, systems, and devices discussed above are examples. Various embodiments may omit, substitute, or add various procedures or components as appropriate. For instance, in alternative configurations, the methods described may be performed in an order different from that described, and/or various stages may be added, omitted, and/or combined. Also, features described with respect to certain embodiments may be combined in various other embodiments. Different aspects and elements of the embodiments may be combined in a similar manner. Also, technology evolves and, thus, many of the elements are examples that do not limit the scope of the disclosure to those specific examples.

What is claimed is:

1. A method comprising:
    positioning a first body relative to a second body to align contacts protruding from a first surface of the first body with electrodes protruding from a second surface of the second body facing the first surface, wherein at least one of the contacts and the electrodes comprises nanoporous metal tips;
    approaching the first body and the second body so that the contacts and the electrodes are separated by less than a predetermined distance after positioning the first body; and
    bonding the contacts with corresponding electrodes by melting and solidifying the nanoporous metal tips after approaching the first body and the second body by heating at least one of the contacts and the electrodes with a laser beam to melt the nanoporous metal.

2. The method of claim 1, wherein the laser beam is projected onto a subset of the contacts and the electrodes at a time.

3. The method of claim 1, wherein the nanoporous metal tips are nanoporous gold tips.

4. The method of claim 1, wherein each of the contacts and each of the electrodes further comprise a solid metal base on the first body or the second body.

5. The method of claim 1, wherein one of the first body and the second body comprises a light emitting diode (LED) having a size that is less than 100 micrometers ($\mu$m) and the other of the first body and the second body comprises a circuit to operate the LED.

6. An electronic device manufactured by a method comprising:
    positioning a first body relative to a second body to align contacts protruding from a first surface of the first body with electrodes protruding from a second surface of the second body facing the first surface, wherein at least one of the contacts and the electrodes comprises nanoporous metal tips;
    approaching the first body and the second body so that the contacts and the electrodes are separated by less than a predetermined distance after positioning the first body; and
    bonding the contacts with corresponding electrodes by melting and solidifying the nanoporous tips after approaching the first body and the second body by heating at least one of the contacts and the electrodes with a laser beam to melt the nanoporous metal.

7. The electronic device of claim 6, wherein the laser beam is projected onto a subset of the contacts and the electrodes at a time.

8. The electronic device of claim 6, wherein the nanoporous metal tips are nanoporous gold tips.

9. The electronic device of claim 6, wherein each of the contacts and each of the electrodes further comprise a solid metal base on the first body or the second body.

10. The electronic device of claim 6, wherein one of the first body and the second body comprises a light emitting diode (LED) having a size that is less than 100 micrometers ($\mu$m) and the other of the first body and the second body comprises a circuit to operate the LED.

* * * * *